United States Patent [19]

Crooks

[11] Patent Number: 4,638,258
[45] Date of Patent: Jan. 20, 1987

[54] REFERENCE LOAD AMPLIFIER CORRECTION SYSTEM

[75] Inventor: Robert C. Crooks, Huntington Beach, Calif.

[73] Assignee: Barcus-Berry Electronics, Inc., Huntington Beach, Calif.

[21] Appl. No.: 669,071

[22] Filed: Nov. 7, 1984

Related U.S. Application Data

[63] Continuation-in-part of Ser. No. 352,794, Feb. 26, 1982, Pat. No. 4,482,866.

[51] Int. Cl.$^4$ .............................................. H03F 1/08
[52] U.S. Cl. .................................... 330/149; 330/105; 330/109; 330/126; 330/151; 360/68
[58] Field of Search ............... 330/102, 105, 107, 109, 330/126, 149, 151; 360/55, 68; 381/71, 94, 96, 98, 103, 120, 121

[56] References Cited

U.S. PATENT DOCUMENTS

| | | |
|---|---|---|
| 3,207,854 | 9/1965 | Johnson ......................... 330/126 X |
| 3,449,518 | 6/1969 | Erath ................................. 381/96 |
| 3,493,682 | 2/1970 | Erath ............................... 381/121 |
| 3,755,754 | 8/1973 | Putz ............................... 330/151 X |
| 4,052,560 | 10/1977 | Santmann ........................... 381/98 |
| 4,130,727 | 12/1978 | Kates ................................ 381/98 |
| 4,340,778 | 7/1982 | Cowans et al. .................. 381/121 X |

Primary Examiner—James B. Mullins
Attorney, Agent, or Firm—Albert L. Gabriel

[57] ABSTRACT

A system which corrects for adverse characteristics such as reactance, inertia and resonances of a power amplifier driven load such as a speaker or multiple speaker system. Program voltage is applied to a reference load which has electrical characteristics which simulate characteristics of the driven load, and the response of the reference load to the program is used to develop a correction voltage signal for the driven load. The program and the correction voltage signal are simultaneously applied to the power amplifier to simultaneously reproduce the program and correct for the adverse characteristics of the load.

18 Claims, 12 Drawing Figures

REFERENCE LOAD AMPLIFIER CORRECTION SYSTEM

RELATED APPLICATION

The present application is a continuation-in-part of Ser. No. 352,794, filed Feb. 26, 1982 for "REFERENCE LOAD AMPLIFIER CORRECTION SYSTEM", which issued Nov. 13, 1984, as U.S. Pat. No. 4,482,866.

BACKGROUND OF THE INVENTION

1. Field of the Invention

The present invention is in the field of amplifiers, and relates particularly to amplifiers which drive loads such as speakers that are highly reactive and are also subject to mechanical distortion influences including inertia and resonances.

2. Description of the Prior Art

For more than forty years, and still according to the current state of the art, audio amplifiers have employed what is commonly referred to as "voltage feedback" in an endeavor to improve frequency response and reduce distortion. Such voltage feedback systems are sometimes referred to in the art as "constant voltage" systems, since for a fixed amplifier input voltage the output voltage remains substantially constant over a broad frequency range or bandwidth. Thus, present audio amplifiers are capable of providing a voltage output for driving a speaker which quite accurately follows the amplifier input program voltage, as to both waveform or shape and phase. However, the conventional magnetic coil-driven speaker (or multiple speaker system) used as a load for such amplifier is essentially a current-driven device, and it has both electrical characteristics and mechanical characteristics which seriously alter the flow of current through it independently of "constant voltage" amplifier drive, thereby preventing the speaker current from coming even close to following the voltage output of the amplifier and instead causing the speaker to depart considerably from the program applied by the amplifier in amplitude, waveform and phase. The general result is that the acoustic response of the speaker is considerably different than the flat voltage response of the "constant voltage" amplifier.

The conventional coil-driven speaker (or multiple speaker system) is a load that is highly inductively reactive. This causes the load impedance to vary with frequency, becoming higher, with power to the speaker consequently lower, as program frequencies rise above the usual 400 $H_z$ nominal or rated impedance point all of the way out to 20 $KH_z$ and higher. By way of example, to illustrate how serious this increase in impedance at higher frequencies can be, the manufacturer's impedance/frequency response curve for a typical state-of-the-art speaker rated 8 ohms at 400 $H_z$ shows the impedance to be doubled to 16 ohms at approximately 4300 $H_z$, and quadrupled to 32 ohms at about 10 $KH_z$. Power is inversely proportional to impedance in a speaker.

The inductive reactance of the speaker load also causes load current to lag in phase from the program, and this phase lag increases with frequency from the 400 $H_z$ rated impedance point all the way to the high end of the sound frequency spectrum. By way of example to show how serious this inductive reactance phase lag can be, measurements made with the speaker referred to in the immediately preceding paragraph showed a phase lag of approximately 33° at 400 $H_z$, approximately 45° at 900 $H_z$, and approximately 70° at 5 $KH_z$. As an integral part of this inductive reactance phase lag, the rise times for high frequency wave fronts or transients which usually contain important program information are slowed way down relative to the actual wave fronts or transients in the program.

The mass of a speaker resists acceleration and deceleration in response to respective rising and falling wave fronts, resulting in inertial lag and overshoot, respectively. Inertial distortion of speaker acoustic output is surprisingly close or analogous to the phase and rise time distortions produced by the inductive reactance of a speaker, so that these effects of inductive reactance and inertia are additive. The adverse effects of inertia, like those of inductive reactance, increase with increasing frequency all of the way out to the high end of the audible spectrum.

Most sounds produced by musical instruments have a sharp attack characterized by a sharply rising initial transient wave front in each fundamental frequency cycle, this initial transient containing most of the high frequency harmonic content of the sound. It has been found that for the human ear to hear the entire spectrum of such sounds, it must receive these initial high frequency harmonic sounds first, followed then by the midrange and low end frequencies. However, the additive or cumulative effects of speaker inductive reactance and inertia in current state-of-the-art amplifier/speaker system cause the rise time to be so slow and the phase lag to be so large at higher frequencies that the sharply rising wave fronts or initial transients which contain most of the high frequency harmonics become masked to a large extent by the lower, heavier frequencies. Such masking of the high frequency harmonics is commonly referred to as "transient distortion," and causes the acoustic output of the system to sound "artificial" or "recorded," instead of sounding completely "live" or "natural" as when the ear properly receives the sharply rising initial transient wave front in its proper order ahead of the lower frequencies.

The typical condenser microphone has a rise time of about 20 to 25 microseconds. In order to make up for the losses at the sound reproduction end, and at the same time reproduce the high frequency harmonic content in the sharply rising initial transient wave fronts captured by such a condenser microphone, it is necessary for an amplifier system to be able to produce a speaker load current rise time that is faster than the microphone rise time, preferably about 10 microseconds or less, and ideally about 5 microseconds or less. Direct solid state pickup transducers, such as those manufactured and sold by Barcus-Berry, Inc. of Huntington Beach, Calif., introduce virtually no delay into the program rise time and where such direct transducers are employed, if the amplifier system has a rise time of not more than about 10 microseconds, and preferably not more than about 5 microseconds, the reproduction will sound completely "live" and "natural." In order to produce such rapid rise times in an amplifier/speaker combination, the speaker load current phase must be held close to "in phase" with the program signal from the 400 $H_z$ nominal impedance point all of the way out to approximately 20 $KH_z$, and preferably the speaker load current should be leading from approximately 1 $KH_z$ all of the way out to approximately 20 $KH_z$. Additionally, in order for the high frequency harmonics to be heard in their proper proportion relative to the other sound components, the attenuation of these high frequency components resulting from speaker inductive reactance must also be overcome.

Applicant has discovered that by deliberately providing the high frequency harmonics and transients with a large phase lead of as much as 180° relative to the midrange frequencies, the resulting separation of the highs from the midrange frequencies enables the highs to be heard by the ear before the midrange, resulting in the highs being heard in much better detail.

Conventional state-of-the-art amplifier/speaker systems are not capable of providing speaker load current with the fast rise time and substantially "in phase" condition required to avoid serious masking problems. Various attempts have been made to solve the problem, and while some of these have improved the rise time and others have improved the phasing, none have heretofore simultaneously produced a rise time on the order of 10 microseconds or less and an "in phase" or leading phase condition of the high frequency harmonics and transients all of the way out to about 20 KH$_z$. Additionally, applicant is not aware of any previous attempts to unmask the high frequencies from the midrange frequencies by providing the high frequencies with a large phase lead of as much as 180° from the midrange frequencies so as to improve the high frequency detail heard. A principal type of equipment currently employed in attempting to solve this problem is the graphic equalizer. Thus, a quality unit in the hi-fi industry is the Bose equalizer marketed with the Bose speaker. This unit has a frequency response curve that is actually too steep and a slightly leading phase up to around 10 KH$_z$, going in phase between about 10 KH$_z$ and 15 KH$_z$, but then the response curve falls off rapidly, and there is a large phase lag after 15 KH$_z$, the lag being approximately 45° at 20 KH$_z$. The resulting rise time is about 45 to 40 microseconds, much too slow to reproduce the high frequency harmonics in the initial transient wave front of most musical instrument sounds.

Below the 400 H$_z$ nominal impedance point, the impedance curve for a conventional speaker rises in a capacitive reactance effect caused by the compliance and open air cone resonance of the speaker. The manufacturer's speaker response curve referred to above shows the impedance to rise sharply below the 150 H$_z$ up to a large impedance peak at 50 H$_z$, and then to slope back down sharply to 8 ohms at 20 H$_z$. This large low frequency impedance peak represents a big hole in the acoustic output of the speaker, so that much of the low frequency information in the program is lost. While some cabinet designs are effective to reduce open air cone resonance at low frequencies, they generally introduce further problems such as speaker cabinet resonances and undesired damping. Unless amplifier compensation can be provided to raise up the low frequency response all of the way down to about 20 H$_z$, much of the low frequency content will be lost, and particularly the low frequency information representing the percussion sounds.

In addition to the poor low frequency response of the typical speaker, the capacitive reactance effect in the region of the rising slope of the cone resonance part of the response curve below 400 H$_z$ produces a seriously leading phase, causing fundamental and low harmonic frequencies in this region, in effect, to overtake the simultaneously phase-lagging high frequency components of the program, further compounding the "masking" problem referred to above.

The most pertinent prior art of which applicant is aware is the Crooks U.S. Pat. No. 4,260,954, issued Apr. 7, 1981, for "Amplifier Load Correction System." The load correction system of this prior patent developed feedback voltage signal representative of current through the driven load, made a comparison between such feedback signal and the amplifier input program voltage, and utilized the results of this comparison to adjust the gain of the program amplifier line to compensate for load current deviations in waveform and phase from the program. This prior system worked well when it sensed the load current of a single speaker, but attempts to employ it in connection with a load that was more complex than a single speaker, such as a plurality of speakers with crossover networks or a multiple speaker distribution line system, were not always satisfactory because the more complex load currents did not necessarily truly represent speaker performance, and the sensing could thus be masked. Another problem with direct sensing of the real load as in Crooks U.S. Pat. No. 4,260,954 was that the real load was unpredictable and often imperfect, having undesirable impedance humps and dips relative to frequency. The prior system was not capable of straightening out such irregularities. The system of U.S. Pat. No. 4,260,954 also had the difficulty that it could not be simply plugged into the amplification line; it also required addtional connections to the driven load.

The Crooks U.S. Pat. No. 4,260,954 disclosed no means for automatically adjusting the average amplitude of the high frequencies relative to the average amplitude of the midrange frequencies to compensate for program imbalance between these frequency ranges. Also, the Crooks U.S. Pat. No. 4,260,954 did not disclose the concept of deliberately introducing a leading phase to the high frequencies so as to separate them and unmask them from the midrange frequencies.

West German Patent No. 2,235,664, published Jan. 31, 1974, was one of the references cited in said Crooks U.S. Pat. No. 4,260,954, the FIG. 2 circuit of that reference being relied upon. However, such circuit as shown and described in this German patent does not suggest use of a reference or model load to correct for the adverse effects of inductive reactance, inertia and resonances of the real speaker load. In fact, the circuit of the German patent does not in any way tend to correct for deviations of speaker load current or acoustic output from the incoming program.

Other references relied upon in said U.S. Pat. No. 4,260,954 which may be of interest relative to the present invention because of a rough general similarity in circuit appearance to circuits in one or more of the forms of the present invention are U.S. Pat. No. 3,902,111 issued Aug. 26, 1975 to Pfisterer, Jr., and U.S. Pat. No. 4,153,849 issued May 8, 1979 to Hall et al. However, these two references are considered to constitute nonanalogous art, in that they are not dealing with any kind of a source of a program voltage signal that is variable as to waveform, or with the typical amplifier load such as speaker that is intended to be driven in response to such a variable waveform program voltage signal and which conventionally has a load current and power output that varies widely and generally continuously from the program voltage signal in both waveform and phase due to its high reactance, inertia, and resonances. Thus, the circuit shown and described in the Pfisterer, Jr. patent appears to be simply a low frequency servo system, with a fixed set point input and no way to put in a program voltage signal variable as to waveform, and with type and values of circuit components completely unrelated to and leading away from the present invention.

The Hall et al patent relates to a circuit for normalizing the operating characteristics of yttrium-iron-garnet (YIG) devices and traveling-wave maser (TWM) devices tuned by a controlled current so that such devices, despite variations in individual ones, can be interchanged in a microwave system without realigning the entire system. Again, no program signal variable as to waveform is applicable to the input, but there is simply a reference DC voltage which is applied to shift the response of the device to the required current-frequency characteristic for the prealigned overall system. The Hall et al patent discloses a positive feedback circuit arrangement having type and values of circuit components completely inapplicable to and leading away from the present invention.

SUMMARY OF THE INVENTION

In view of these and other problems in the art, it is an object of the present invention to provide a system which substantially completely corrects for adverse characteristics of an amplifier-driven load that would otherwise cause the output of the load to deviate from the applied program, such adverse characteristics including but not being limited to electrical reactance, inertia, resonances, and the like.

Another general object of the invention is to provide an amplifier load correction system which has particular utility in audio systems, substantially completely correcting for the normally seriously distorting effects of inductive reactance, inertial lag and overshoot, and speaker compliance and associated open air cone resonance.

Another object of the invention is to provide an amplifier load correction system capable of so completely overcoming the usual phase lagging characteristics of a speaker which increase from the nominal or rated 400 $H_z$ frequency all of the way out to 20 $KH_z$ caused by both inductive reactance and inertia, that for the first time in the art the speaker load current phase can be held substantially completely "in phase," and even slightly leading in phase, from 400 $H_z$ all of the way out to 20 $KH_z$, while simultaneously the rise time can be kept below about 10 microseconds in all forms of the invention, and within about a 2 to 5 microsecond range for some forms of the invention. Another related object of the invention is to provide an amplifier load correction system capable of providing a load current rise time that is sufficiently rapid and has sufficient amplitude, together with the simultaneous maintenance of a substantially completely "in phase" condition from approximately 400 $H_z$ all of the way out to approximately 20 $KH_z$, to enable the amplifier-speaker system to faithfully reproduce the sharply rising initial transient fronts containing most of the high frequency harmonics in musical instrument and some voice frequency sounds, and delivering this sharply rising initial transient wave front and then the midrange and low end frequencies to the ear in the correct sequential order, thereby completely overcoming transient distortion masking, and enabling the reproduced sounds for the first time to be perceived as completely "live" and "natural" in form, rather than sounding "artificial" or "recorded" as from prior art systems.

Another object is to provide an amplifier load correction system of the character described in which a large leading phase of as much as 180° is deliberately applied to the high frequencies relative to the midrange frequencies so as to set the high frequency harmonics and transients out to the ear before the onset of hearing the midrange frequencies, and thereby substantially completely unmask the high frequencies from the midrange frequencies.

Another object is to provide an amplifier load correction system capable of providing a low frequency lagging load current phase so as to compensate for the normally leading phase of a speaker in the region of the rising slope of the cone resonance part of the speaker response curve below 400 $H_z$, such low frequency phase compensation further assisting in the avoidance of masking of the high frequency harmonics by low frequency sound components.

Still another related object is to provide an amplifier load correction system capable of producing a load current rise time considerably faster than the 20 to 25 microsecond rise time of the typical condenser microphone, so as to make up for losses at the sound production end, and at the same time reproduce the high frequency harmonic content in the sharply rising initial transient wave fronts captured by such a consenser microphone.

Another object of the invention is to provide an amplifier load correction system which, while providing fast rise time and phase corrections, at the same time corrects for the normally poor speaker impedance curve, and hence power output response, both in the high frequency range from 400 $H_z$ all the way out to 20 $KH_z$ and in the low frequency range from 400 $H_z$ all the way down to below 20 $H_z$.

Another, more specific object of the invention is to provide an amplifier load correction system which develops the correction signal from a reference load that serves as a model of the characteristics of the real load, such reference load being completely isolated and independent of the real driven load. A further object is to provide an amplifier load correction system which develops the correction signal from a reference load that serves as an equivalent model for the inductance of the real speaker load, and also serves as an analog model for the mechanical inertia of the speaker load, the system providing a sufficient correction amplitude to simultaneously correct for the usual adverse effects of both the inductive reactance and the inertia of the real speaker or speaker system. Similarly, it is an object to provide a reference load amplifier correction system wherein the reference load also serves as an equivalent model for the capacitance of the real speaker system load and at the same time as an analog model for the compliance and related open air cone resonance of the speaker system, to correct for these speaker characteristics.

Another object is to provide an amplifier load correction system which, by deriving its correction signal from a reference or model load instead of deriving the correction signal from the real driven load, enables the correction to be based upon a substantially perfect or ideal load, so that the corrected transducer ouput can be a substantially perfect reproduction of the program.

A related object is to provide an amplifier load correction system which, by employing a reference or model load that is completely independent of and isolated from the real driven load, provides a correction signal that is not limited or distorted by unpredictable imperfections such as impedance humps and dips in the real load.

Still another related object is to provide an amplifier load correction system which, by employing a reference or model load independent of the real driven load, enables the correction system to be employed in connection with multiple speaker systems, such as a plurality of speakers with crossover networks or a multiple speaker distribution line system, whereas such multiple speaker systems might provide a confused basis for correction in prior systems which compare current through the real driven load with the program signal.

Another object is to provide an amplifier load correction system which is particularly easy to hook up in any amplifier-speaker system, requiring only an input jack from the preamplifier and an output jack to the power amplifier, and not requiring the additional connections to the driven load as were required in systems which sensed load current in the real driven load.

An additional object is to provide a reference load amplifier correction system of the character described wherein the reference load includes inductor and capacitor components, or circuits simulating such components, which are scaled up to have much larger values than the corresponding inductance and capacitance characteristics of the real driven load represented by the reference load, to minimize current through the reference load and hence power required to drive the reference load.

Still another object is to provide an amplifier load correction system of the character described in which the high frequencies, midrange frequencies and low frequencies are separated out into three separate channels so that the amplitudes can be adjusted relative to each other for generally flat performance from approximately 20 $H_z$ all of the way up to 20 $KH_z$. A related object is to provide an automatic balancing system between the high frequency and midrange frequency channels so if the average amplitude of the high frequencies increases or decreases relative to the average amplitude of the midrange frequencies, the gain of the high frequency channel will automatically be respectively reduced or increased to bring the amplitudes of the high and midrange frequency channels into desired balance despite imbalances that may occur in the program.

According to the invention, program signal is applied to a reference load having both inductor and capacitor components, or circuits simulating such components, so as to develop respective high and low frequency correction signal components. These inductor and capacitor components (or simulations thereof) of the reference load are preferably tuned to cancel and provide zero correction signal from the system at approximately the 400 $H_z$ nominal impedance frequency of most speakers and speaker systems, the inductor component (or simulation thereof) of the reference load developing a high frequency correction signal for frequencies from approximately 400 $H_z$ all of the way out to approximately 20 $KH_z$, and the capacitor component (or simulation thereof) of the reference load developing a low frequency correction signal for frequencies from approximately 400 $H_z$ down to below about 20 $H_z$.

Since circuits simulating an inductor or a capacitor can be employed in place of actual inductors and capacitors as reference load components in the various forms of the present invention, for convenience and conciseness in the following description of the invention and in the appended claims, the terms "inductor component," "inductor component means," "capacitor component" and "capacitor component means" are hereby defined to mean both real and simulated inductor and capacitor components.

In some forms of the invention, the reference load is a single series-tuned inductor-capacitor circuit from which the high and low frequency correction signal components are developed together. In other forms of the invention, separate high and low frequency channels are employed, the high frequency channel containing the inductor reference load component and the low frequency channel containing the capacitor reference load component. The correction signal outputs of the high and low frequency channels are mixed with the program signal in a summing amplifier for delivery to the power amplifier that drives the real load. This use of separate high and low frequency correction signal channels, with a further independent program signal channel, enables the amplitudes of the high and low frequencies to be independently adjusted relative to the program signal and each other, so that the signals may be delivered in optimum relative proportions to the power amplifier driving the real load.

In some forms of the invention, the inductor and capacitor components in respective high and low frequency channels are simplified RC (resistor and capacitor) phase shifting networks which shift the phases of the high and low frequency portions of the audio spectrum in the appropriate directions and are at the same time amplitude responsive to frequency, so as to provide substantially complete compensation for adverse characteristics of the load resulting from inductive and capacitive reactances and load inertia. This is particularly useful in the high frequency channel because it enables a small, inexpensive RC circuit-type inductor component to be employed in lieu of a real choke, thereby permitting the undesirable bulk and high cost of a real choke inductor to be eliminated from the system, and enabling the load correction circuit of the invention to be embodied in a small hybrid IC (integrated circuit) chip.

In one form of the invention in which there are separate high, midrange and low frequency channels, amplitude imbalances are detected between the average amplitude of the high frequencies and average amplitude of the midrange frequencies, and the average amplitude of the high frequencies is automatically readjusted to re-establish a balance between the high and midrange frequencies. Such automatic readjustment is accomplished by a detector and summing system wherein a negative DC output detector senses the signal in the high frequency channel and produces a DC voltage analog thereof, a positive DC output midrange detector senses the signal in the midrange channel and produces a DC analog thereof, and the minus and plus DC outputs of these detectors are mixed in a summing amplifier, the DC output of which automatically adjusts a variable resistor to readjust the gain of the high frequency channel as required.

In one form of the invention which has separate high, midrange and low frequency channels, one of the high and midrange channels has an inverter therein which gives the high frequencies a 180° phase lead over the midrange frequencies, setting the high frequency harmonics and transients out to the ear before the onset of hearing the midrange frequencies and thereby substantially completely unmasking the high frequencies from the midrange frequencies.

In another form of the invention, adjustment of the correction signal relative to the program signal is provided for by having two channels, the correction signal containing both high and low frequency correction components being developed in one channel in which the program signal is cancelled so that the correction signal can be independently adjusted, and the other channel being a direct program signal channel. The adjusted correction signal and the program signal are mixed in a summing amplifier for delivery to the power amplifier that drives the real load.

In some forms of the invention, current through the reference load is sensed and a voltage feedback signal representative of reference load current is compared with the program signal voltage in a differential operational amplifier (or in separate differential operational amplifiers if separate high and low frequency correction chanels are employed) to develop the correction signal that is to be delivered to the power amplifier along with the program signal. In other forms of the invention, the inductor component of the reference load is arranged, and prefereably each of the inductor and capacitor components of the reference load is arranged in a separate channel voltage divider network from which the correction signal component is derived; and the correction signals, which are independently adjustable, are mixed with the program signal in a summing amplifier for delivery to the power amplifier that drives the real load.

BRIEF DESCRIPTION OF THE DRAWINGS

These and other objects of the invention will become more apparent in view of the following description taken in conjunction with the drawings, wherein.

DETAILED DESCRIPTION

Figure 1:
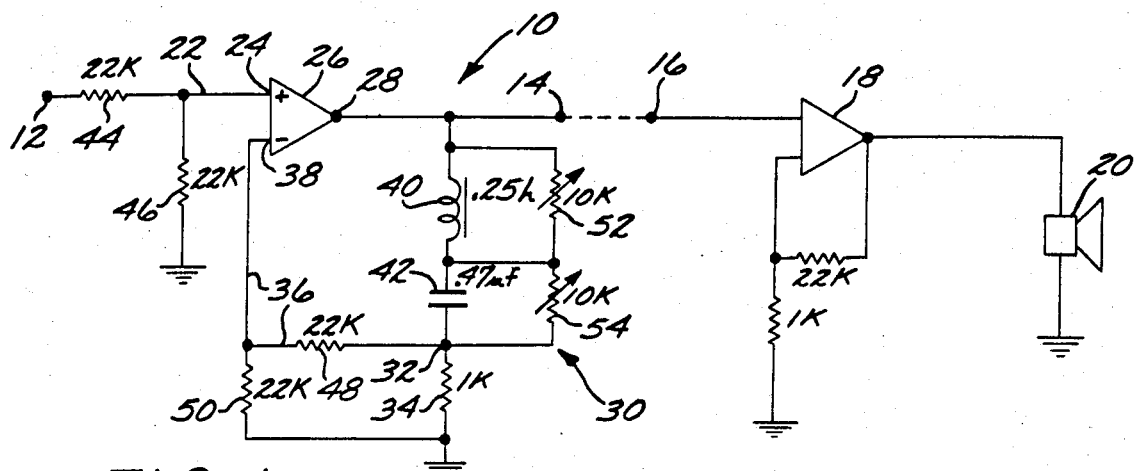
FIG. 1 is a circuit diagram showing a form of the invention in which the reference load is a single series-tuned inductor-capacitor circuit, and a feedback signal representing reference load current is compared with the incoming program signal in a differential operational amplifier connected as a current amplifier.

Referring to the drawings, FIG. 1 is a circuit diagram illustrating a first form of the reference load amplifier correction circuit or system of the present invention. The reference load correction circuit shown in FIG. 1 is illustrated in operative association with a power amplifier and speaker load which may be any existing, conventional state-of-the-art power amplifier and speaker components. Although such power amplifier and associated load are not shown in the other circuit forms of the invention illustrated in FIGS. 2–9, it is to be understood that the power amplifier and load will be connected to the output terminals of each of the other circuit forms of the invention shown in FIGS. 2–9 in the same manner as in the circuit form of FIG. 1.

The reference load correction circuit or system shown in FIG. 1 is generally designated 10, and includes input and output terminals 12 and 14, respectively. Input terminal 12 is electrically connected to a program source, which will generally include a conventional state-of-the-art preamplifier. The correction circuit output terminal 14 is connected to the input terminal 16 of power amplifier 18 which may be a conventional state-of-the-art power gain block. To assure adequate amplifier power is available for the reference load correction circuit 10 of the invention to substantially completely conform the output of the load transducer to the waveform and phase of the program input to correction circuit 10, over a wide frequency band, it is preferred that the power amplifier 18 have a power gain of at least approximately 20. Additionally, in order to assure that the power amplifier does not introduce any material waveform distortion, it is preferred that its frequency response be substantially flat (in the constant voltage mode) from approximately 20 $H_z$ to approximately 20 $KH_z$.

While the reference load correction circuit 10 of the invention will normally be connected between a preamplifier and a power amplifier, it is to be understood that it may be disposed at any location in the line of components from the program source to the power amplifier.

While the reference load correction circuit of the present invention is capable of correcting for the defects or deficiencies of any amplifier-driven load, the typical load will be a speaker load such as that found in a hi-fi, television or radio set. The speaker load may be a single speaker, such as the speaker 20 diagrammatically illustrated in FIG. 1, or may consist of multiple speakers with crossover networks. The reference load correction circuit of the invention is also suitable for load correction in a multiple-channel amplifier system where the channels are bridged together for a monaural output of multipled power. The reference load correction circuit of the invention is also available for load correction in a distribution line system (e.g., 70 volts) to a number of speakers, as sometimes employed in theaters. In all multiple speaker systems where the reference load correction circuit of the invention is employed, the circuit of the invention will substantially completely correct for both the electrical (reactance) and mechanical (inertial) deficiences of each of the plurality of speakers in the system.

The program signal furnished to the correction circuit input terminal 12 is a voltage signal variable as to waveform according to the music, voice or other program information which it contains. Under conventional circumstances, without the presence of the reference load correction circuit or system 10 of the invention, after amplification in the constant voltage power amplifier 18, this variable waveform program signal would be subjected to severe amplitude and phase distortions by the high inductive reactance, the mechanical inertia, and the open air cone resonance of the speaker device load 20, as discussed in detail hereinafter in connection with the load correction characteristics of the invention.

The input program signal is conducted from input terminal 12 through a conductor 22 to the noninverting input 24 of a balanced differential operational amplifier 26. The output 28 of operational amplifier 26 is connected to the correction circuit output terminal 14, and also to one side of the reference load of the invention generally designated 30. The other side of reference load 30 is connected to a sensing point and thence through a sensing resistor 34 to ground. The sensing resistor 34 senses current flow through the reference load 30 and thus develops a feedback voltage signal at sensing point 32. This feedback voltage signal is conducted through a conductor 36 back to the inverting input 38 of the differential operational amplifier 26.

The reference load 30 consists of an inductor component 40 and a capacitor component 42 which are in series. The inductor component 40 causes a phase lag of the current through reference load 30 relative to the phase of the program signal at input terminal 12 and operational amplifier output 28, while the capacitor component 42 causes a phase lead of the current through reference load 30 relative to the program voltage signal at input terminal 12 and operational amplifier output 28. The values of inductor component 40 and capacitor component 42 are preferably chosen so that the reference load circuit 30 is series-tuned at approximately 400 $H_z$, so as to conform the reference load correction circuit 10 to the usual 400 $H_z$ nominal or rated impedance point of speaker systems. By referring to the reference load circuit 30 as being tuned to approximately 400 $H_z$, it is meant that the reactances of inductor component 40 and capacitor component 42 cancel at that frequency; i.e., the phase shifting effects of inductor component 40 and capacitor component 42 cancel at that frequency. Thus, the only impedance left in the reference load circuit is the resistance of the inductor component 40, which is quite low.

The input from input terminal 12 to the noninverting input 24 of differential operational amplifier 26 includes an input network consisting of a pair of resistors 44 and 46 equal in value. Similarly, the feedback circuit from sensing point 32 to the inverting input 38 of operational amplifier 26 includes a feedback network consisting of a pair of resistors 48 and 50 equal in value to each other and also to each of the input network resistors 44 and 46. These equal values of the input network resistors and feedback network resistors cause the differential operational amplifier 26 to have unity transfer gain for a 400 $H_z$ program signal, for which the load current through the reference load 30 will have its maximum value, or will in effect go straight through the reference load 30, and the feedback voltage signal at sensing point 32 will likewise have a maximum value above ground. With this unity transfer gain of differential operational amplifier 26, it will not introduce any detectable residual background noise into the amplification line, which was a problem in some prior systems.

Because the two differential inputs of the operational amplifier 26 are being continuously fed the respective program and feedback signals through the respective conductors 22 and 36, the differential operational amplifier 26 is continuously comparing the current through the reference load 30 with the input program voltage as to both amplitude and phase, to continuously produce a correction signal in addition to the amplified program signal at the operational amplifier output 28. This correction signal continuously and instantaneously corrects for both the phase shifts and reactance value changes in both the inductor component 40 and the capacitor component 42 which result from variations of the program frequency from 400 $H_z$, no matter how wide such variations may be within the bandwidth of the correction circuit 10. This correction is so complete and so instantaneous for both phase and amplitude that the sensing point 32 is established as a rock-solid constant current point representative of minus program voltage.

Figure 10:
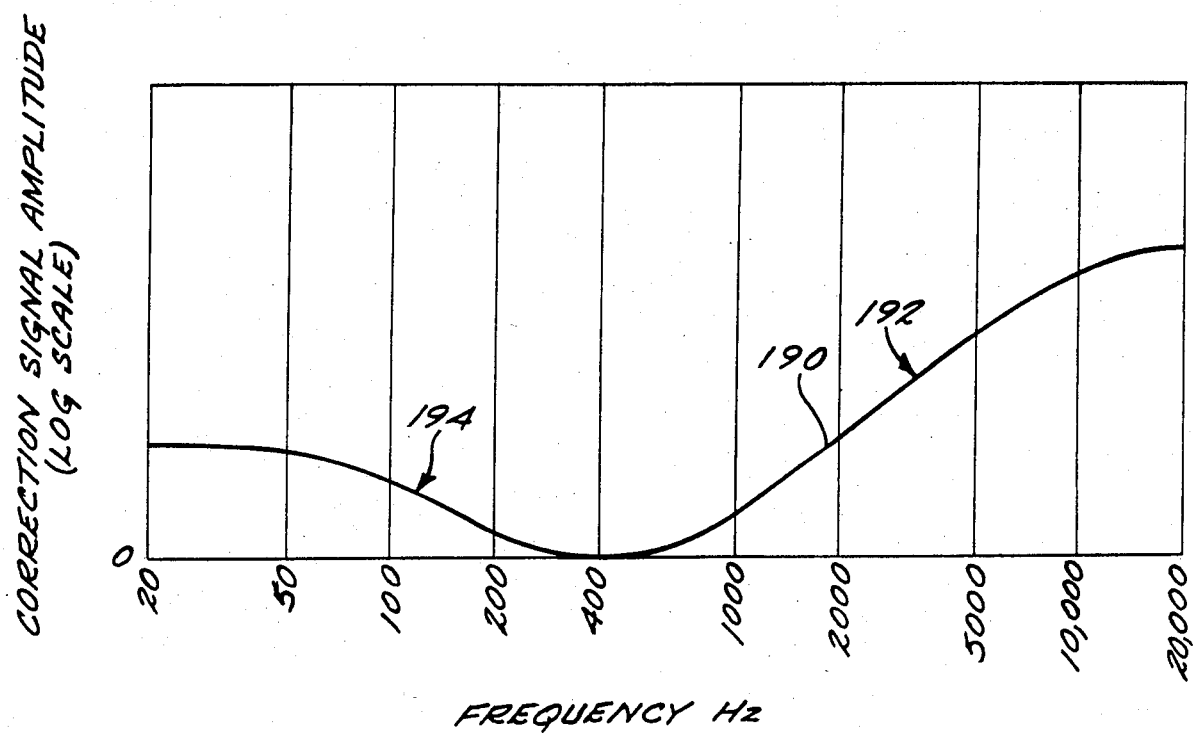
FIG. 10 is a correction signal amplitude vs. frequency curve for the correction signal of the present invention from 20 $H_z$ to 20 $KH_z$.
Figure 11:
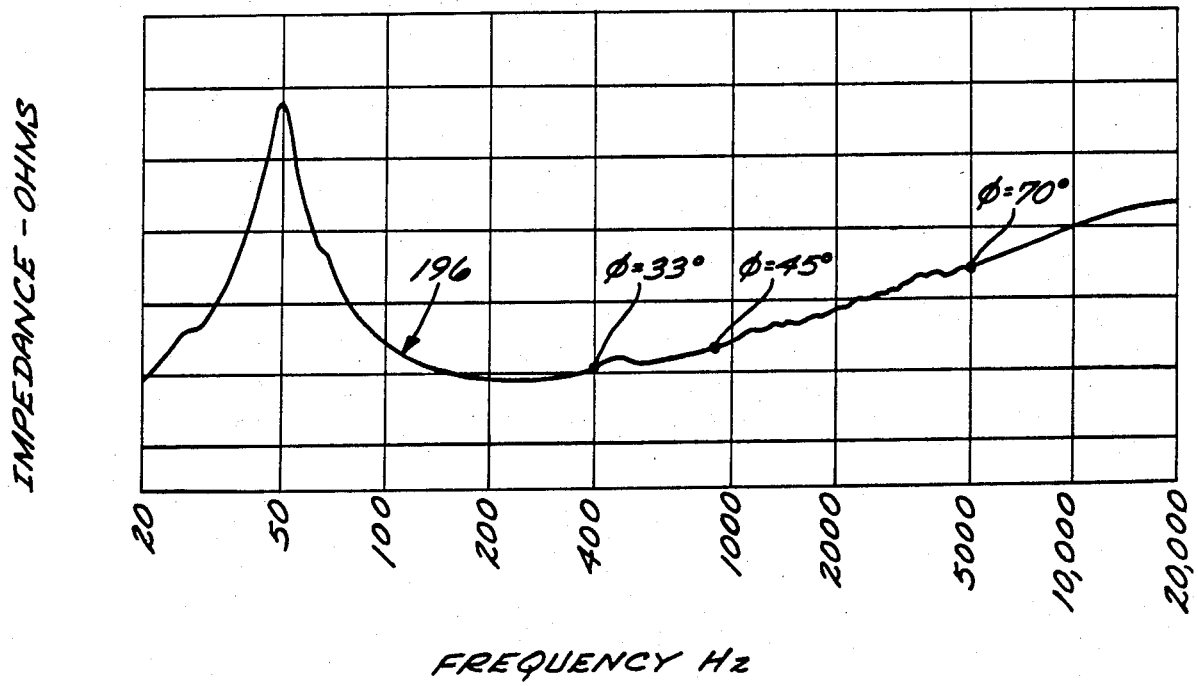
FIG. 11 shows a total impedance vs. frequency response curve for a typical speaker that is rated 8 ohms at 400 $H_z$.

As program signal frequency components go up from the 400 $H_z$ series-tuned value of the reference load 30, the corresponding increased reactance of the reference load inductor component 40 causes a reduced current through sensing resistor 34, a corresponding reduced feedback voltage level at sensing point 32, and a corresponding increased correction signal component of the output 28 of differential operational amplifier 26. Similarly, below the 400 $H_z$ tuned value of reference load 30, the increased reactance of the reference load capacitor component 42 will increase the value of the correction signal component of the output 28 of differential operational amplifier 26. The result is that a plot of correction signal amplitude vs. frequency produces a curve similar to a conventional speaker reactance curve. Such a curve for the correction signal is shown in FIG. 10 and for speaker reactance is shown in FIG. 11, and these curves will be discussed more in detail hereinafter. Resistors 52 and 54 are connected in parallel with the respective reference load inductor component 40 and capacitor component 42. Adjustment of these resistors 52 and 54 sets the upper limits of the respective reactances 40 and 42, and correspondingly the upper limits of the correction signal amplitude vs. frequency curve proximate the respective upper and lower frequency ends of the bandwidth of the correction circuit 10. The value selected for the sensing resistor 34 determines the slope of the correction signal curve.

It is to be noted that not only is the correction signal component at the output 28 of operational amplifier 26 fed to the reference load 30, but it is at the same time fed to the correction circuit output terminal 14 and thence to the input terminal 16 of power amplifier 18 right along with the program signal. Amplification of the correction signal in power amplifier 18 provides the correction signal with the required power to substantially completely correct for amplitude and phase distortions that would otherwise be caused by the inductive and capacitive reactances, the cone resonance of the speaker or speaker system, and mechanical distortions that would otherwise be caused by the inertia of the speaker and particularly by the mass of a magnetic speaker coil.

The load 30 employed to develop the correction signal has heretofore been referred to as a reference load, but it may also suitably be referred to as a synthetic load, a phantom load, an equivalent load, a simulated load, a model load, or an artifical load.

While the inductor component 40 and capacitor component 42 of reference load 30 have relative values that approximately represent a typical speaker system load, such values are preferably scaled upwardly many times above the corresponding values in an actual speaker system, and this allows the current-sensing resistor 34 to be correspondingly scaled up in value. Such higher values of the circuit components of reference load 30 and of sensing resistor 34 permit the differential operational amplifier 26, which is a power amplifier in the FIG. 1 form of the invention, to be a low power amplifier chip. Nevertheless, since the inductor component 40 and capacitor component 42 of reference load 30 are in correct proportions to represent a true speaker system load, the correction signal developed by the reference load 30 will be compatible with any speaker load system so as to substantially completely correct for the electrical and mechanical deficiencies of the speaker system.

The reference load correction circuit 10 of FIG. 1 is a current-operated system, and it therefore has a high output impedance which requires a load above approximately 10 K (10,000 ohms). This can be overcome by changing the circuit to a voltage amplifier as shown in FIG. 2, which reduces the load requirement to approximately 2 K (2,000 ohms).

Figure 2:
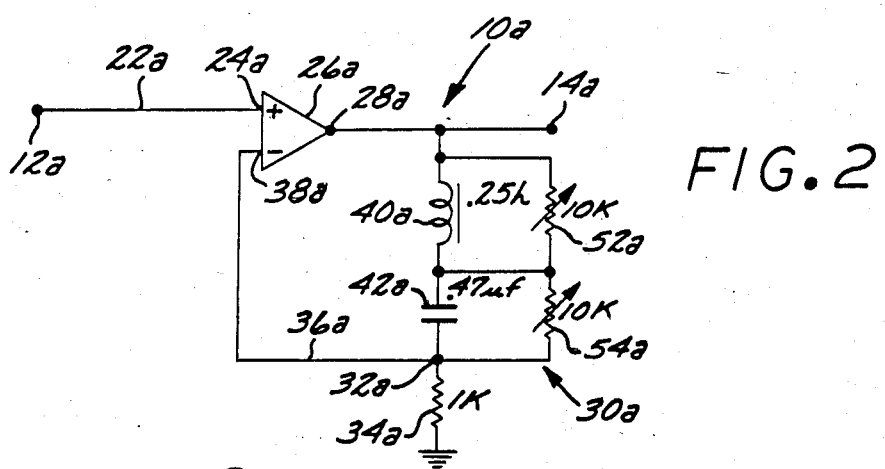
FIG. 2 is a circuit diagram showing another form of the invention which is similar to the form shown in FIG. 1, but has the differential operational amplifier arranged as a voltage amplifier.

The reference load correction circuit shown in FIG. 2 is generally designated 10a, and differs from the circuit of FIG. 1 principally in the elimination of the two feedback network resistors. The input network resistors of the FIG. 1 form may be included if desired but are not required. Otherwise, the circuit components of the voltage amplifier form of the invention shown in FIG. 1 may be the same as the circuit components of the current amplifier form of FIG. 1. Thus the program signal is introduced at input terminal 12a and conducted through conductor 22a to the noninverting input 24a of a balanced differential operational amplifier 26a. The output 28a of operational amplifier 26a is connected both to the output terminal 14a of circuit 10a as the input to a power amplifier driving the real load, and to one side of the reference load generally designated 30a. Reference load 30a includes series-connected inductor component 40a and capacitor component 42a, which may have the same values as the corresponding circuit components in FIG. 1 and are series-tuned at approximately 400 Hz; and the reference load 30a also includes respective adjustable shunt resistors 52a and 54a across inductor component 40a and capacitor component 42a which serve the same purpose as the corresponding circuit components in FIG. 1. The other side of reference load 30a is connected to sensing point 32a which is connected to sensing resistor 34a and also, through conductor 36a, to the inverting input 38a of differential operational amplifier 26a. Except for being in the form of a voltage amplifier with its reduced output load requirement, instead of a current amplifier, the reference load correction circuit 10a shown in FIG. 2 operates in the same way as the reference load correction circuit 10 shown in FIG. 1, and produces the same results.

It is to be noted that each of the respective differential operational amplifiers 26 and 26a of FIGS. 1 and 2 is arranged without voltage feedback as a variable gain amplifier so as to enable it to produce the continually varying correction signal of the invention.

Most musical instrument sounds have a sharp attack characterized by a sharply rising initial transient wave front containing most of the high frequency harmonics of the sound, such sharply rising wave fronts being produced at a repetitive rate according to the fundamental frequency of the sound. In order for the human ear to hear the entire spectrum of such sounds, it must receive the upper partials first, and then the heavier fundamental sounds. When received in this order, all of the sound components are heard and are perceived as being completely "natural" in form, rather than sounding "artificial" or "recorded," as most processed sounds heretofore have been perceived. A principal problem with prior art amplifier/speaker systems is that the reactance and mechanical inertia of the speaker system prevents the speaker or speakers from accelerating rapidly enough at the onset of each cycle of the fundamental frequency to reproduce the sharply rising wave fronts or initial transients which contain most of the high frequency harmonics before the midrange and low end frequencies are reproduced by the speaker or speakers, which results in the high frequency harmonics being masked to a large extent by the lower, heavier frequencies. Typically, such masking can result in a total loss of up to about 50 percent of the high frequency harmonic content of the sound. Thus, with conventional amplifier/speaker systems, the "tinkly" sounds of bells, chimes and the like which add so much to the reality of music virtually disappear. Even the timbre of a voice is changed relative to the vowel sounds if subjected to such speaker distortion influences. This masking of the high frequency harmonic content of sounds in prior art systems is commonly referred to as "transient distortion," and has heretofore been simply accepted in the art as an inherent deficiency in amplifier/speaker systems.

To substantially completely cure this transient distortion problem, the amplifier must be capable of driving the speaker system in an acoustic rise time of no more than approximately 10 microseconds and with substantially zero phase lag from the 400 Hz crossover frequency all the way up to approximately 20 KHz. The term "rise time" as employed herein refers to the time duration of the initial, rising quarter of a full sine wave cycle. Thus, a 10 microsecond rise time is equivalent to a frequency of 25 KHz.

Applicant has found that the high frequency harmonics can be even further unmasked by deliberately providing them with a phase lead relative to the low and midrange frequencies. This is accomplished in the circuit shown in FIG. 9, and will be described in detail hereinafter in connection with that circuit.

Experimental prototypes of the reference load correction circuits 10 and 10a of FIGS. 1 and 2, respectively, exhibit rise times between about 5 and 10 microseconds, so that these circuits have a bandwidth ranging from about 50 KHz to about 25 KHz. This sharp rise time in the range of from about 5 to 10 microseconds enables the reference load correction circuits of FIGS. 1 and 2 to make a full phase correction in the load up to approximately 10 KHz, and to hold the load close to in phase up to around 20 KHz, although in some cases the prototype circuits of FIGS. 1 and 2 appeared to allow a slight phase lag at 20 KHz. It is preferable, however, for the correction circuit to produce a slightly leading or anticipatory phase from the 400 Hz crossover frequency all of the way up through the high end of the frequency spectrum, including 20 KHz. This requires a rise time no longer than about 5 microseconds, and preferably between about 2 and 5 microseconds, which is produced in other forms of the invention as described below. Such a slight leading phase assures that the actual acoustic output of the speaker system will be at least in phase, and thereby assures the correct order of reproduction by the speaker system of the upper partials first and then heavier lower harmonics and fundamental sounds.

Although for most speaker systems the load correction provided by the circuits of FIGS. 1 and 2 has proven to be excellent, there appears to be a practical limitation on the amount of correction available from these circuits in the higher frequencies. This is evidenced by the fact that when the variable resistor 52 (or 52a) which shunts the inductor 40 (or 40a) in the reference load 30 (or 30a) is turned up to raise the Q of the inductor circuit to a high value, both rise time and phase correction appear to become slightly impaired, and also an unnatural brightness appears to be introduced into some types of sound.

Another minor problem with the reference load correction circuits of FIGS. 1 and 2 is that they exhibit a harmonic distortion at full output on the order of approximately 0.8 percent. It is nevertheless questionable whether the rise time, phase and harmonic distortion limitations of the circuits of FIGS. 1 and 2 would be audible to the average listener.

Figure 4:
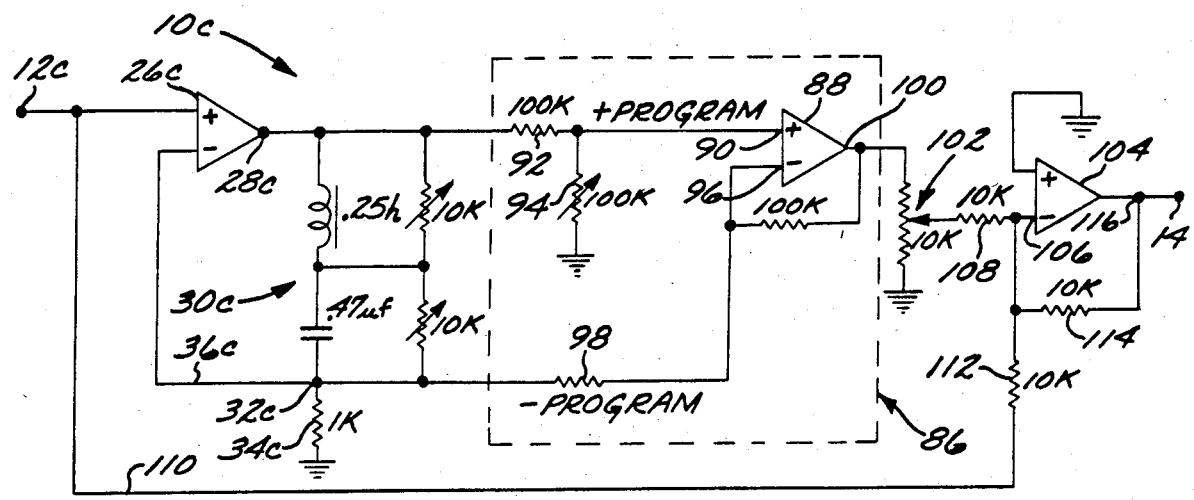
FIG. 4 is a circuit diagram illustrating another form of the invention wherein the correction signal is developed in a circuit similar to that of FIG. 2, and separated out of the program signal for independent adjustment, and is then re-united with the program signal in a summing amplifier.

The reference load correction circuit or system disclosed in FIG. 4 provides for separating the correction signal out from the program signal so that the correction signal may be amplified to any desired extent relative to the program signal, and then mixing the correction signal back in with the program signal; while the load correction circuits or systems of FIGS. 5-9 provide separate circuit portions for the high and low frequency load correction above and below the 400 Hz crossover frequency. These features of the correction circuits of FIGS. 4-9 enable the amount of the correction of the higher frequencies to be adjusted to shorten the rise time to within a range of from about 2 to about 5 microseconds, to provide a slightly leading phase from a little above the crossover frequency of 400 Hz up to the top end of the spectrum at about 20 KHz, and to enable the correction signal to be sufficiently powerful to substantially completely overcome both speaker reactance and speaker inertia.

Figure 3:
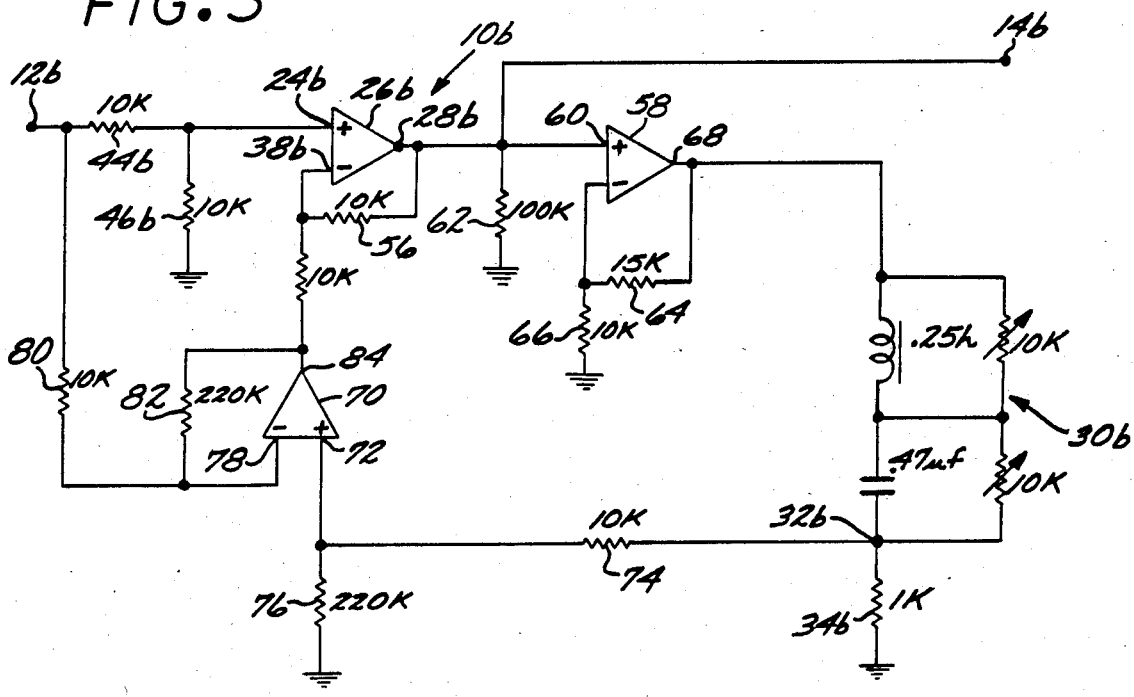
FIG. 3 is a circuit diagram showing another form of the invention which is similar to the forms shown in FIGS. 1 and 2, but which makes the comparison between the feedback voltage and the program signal voltage in a separate comparator rather than in a line differential operational amplifier.

Before describing the details of the circuits of FIGS. 4-9, a third form of reference load correction circuit, similar to the correction circuits of FIGS. 1 and 2, will be described. In this circuit, shown in FIG. 3 and generally designated 10b, the program applied to input terminal 12b passes through an input resistor network consisting of resistors 44b and 46b to the noninverting input of balanced variable gain differential operational amplifier 26b having an output 28b at which appear both the program voltage signal and the correction voltage signal. Operational amplifier 26b has a conventional feedback resistor 56 connected between its output 28b and its inverting input 38b. The mixed program signal and correction signal are fed from the operational amplifier output 28b to the output terminal 14b of correction circuit 10b, the circuit output terminal 14b being adapted for connection to the input of a power amplifier which drives the main load in the same manner as in FIG. 1. The circuit of FIG. 3 is also similar to that of FIG. 1 in that a low power, current amplifier chip is employed, but in FIG. 3 this is a separate operational amplifier 58 that is employed for driving the reference load 30b. Amplifier 58 receives at its noninverting input 60 the same mixed program and correction signal from differential amplifier output 28b as is fed to the system output 14b. Low power amplifier 58 includes an input resistor 62 and a feedback network consisting of resistors 64 and 66. The output 68 of amplifier 58 is connected to one side of the reference load 30b, the other side of which is connected to sensing point 32b. Sensing resistor 34b connected between sensing point 32b and ground develops a feedback voltage signal representative of the reference load current. The reference load 30b and its current-sensing resistor 34b may be the same as the corresponding circuit components of the circuits shown in FIGS. 1 and 2, serving to provide a similar voltage feedback signal.

The principal difference between the system of FIG. 3 and those of FIGS. 1 and 2 is that the load correction signal in the system of FIG. 3 is not developed in a differential amplifier in the program signal line, but instead is developed in a separate differential comparator 70 which is a balanced differential operational amplifier similar to the differential operational amplifier 26b. The feedback voltage signal developed across sensing resistor 34b is fed to the noninverting input 72 of differential comparator 70 through an input network consisting of resistors 74 and 76. Thus, the noninverting input 72 of differential comparator 70 receives a feedback voltage signal that continuously represents both the amplitude and the phase of the reference load current. The inverting input 78 of differential comparator is connected through an input network consisting of resistors 80 and 82 to the program input terminal 12b so that the inverting input 78 continuously receives a voltage signal representing the incoming program. The differential comparator 70 thus produces the desired correction voltage signal at its output 84 that represents a continuous, instantaneous differential comparison between the program and feedback voltages. The correction voltage signal is applied from comparator output 84 to the inverting input 38b of variable gain differential line amplifier 26b so as to mix the correction voltage signal with the program voltage signal at the output 28b of amplifier 26b and at the system output 14b.

Referring now to FIG. 4, the reference load correction circuit 10c shown in this figure includes the same circuit components as the reference load correction circuit 10a shown in FIG. 2 for initially developing the correction signal voltage admixed with the program signal voltage. Thus, the program provided at input terminal 12c is delivered to the noninverting input of balanced differential operational amplifier 26c, the output 28c of which is connected to one side of reference load 30c which is a series-tuned inductor component-capacitor component circuit. The other side of reference load 30c is, as in FIG. 2, connected to sensing point 32c, reference load current passing from sensing point 32c through sensing resistor 34c to develop the current-representative feedback signal, this feedback signal being delivered through conductor 36c back to the inverting input of differential operational amplifier 26c.

The reference load correction circuit 10c of FIG. 4 inclds a program signal cancellation circuit generally designated 86 which, for convenience, is shown outlined or enclosed in dotted lines.

The cancellation circuit 86 includes a balanced differential operational amplifier 88 which receives positive program signal plus the correction voltages at its noninverting input 90 from the output 28c of differential amplifier 26c through an input network consisting of a fixed resistor 92 and a variable resistor 94. The inverting input 96 of differential amplifier 88 receives negative program voltage from the sensing point 32c through an input resistor 98. The variable resistor 94 is adjusted to zero the balanced differential amplifier 88 at its output 100 at 400 Hz, leaving only the correction voltages at the output 100; i.e., leaving only the high slope and low slope respectively above and below 400 Hz, or the correction areas, of the correction signal amplitude vs. frequency curve shown in FIG. 10. This separated correction signal is mixed back into the main program through a gain control potentiometer 102 into a summing amplifier 104. Both the correction signal and the program signal are introduced into summing amplifier 104 at its inverting input 106, the correction signal being introduced through an input resistor 108, while the program signal bypasses both the reference load correction circuit 10c and the program signal cancellation circuit 86, being conducted directly from program input terminal 12c through conductor 110 and input resistor 112. Summing amplifier 104 has a feedback resistor 114 between its output 116 and input 106. The output 116 of summing amplifier 104 is then connected to the output terminal 14c of the system, which in turn is adapted for connection to a power amplifier and real load combination.

The correction signal separation type correction circuit of FIG. 4 has several advantages over the reference load correction circuits of FIGS. 1, 2 and 3. It has an improved rise time of approximately 3 microseconds. The correction signal produced in the circuit of FIG. 4 will cause the load current through the real load to have the desired slight leading phase from proximate the 400 $H_z$ crossover frequency all of the way up to 20 KHz, thus providing the desired anticipatory phase which assures that the actual acoustic output of the speaker system will be at least in phase and will reproduce the upper partials and then the lower harmonics and fundamental frequency in the correct order. An important advantage of the circuit of FIG. 4 over those of FIGS. 1–3 is that the correction adjustment does not change the rise time or phase. This enables a greater amount of correction to be provided by the circuit of FIG. 4. It has been found that the Q of the inductor component circuit portion of reference load 30c in FIG. 4 can be taken up to approximately double the value of the Q in the circuits of FIGS. 1–3. Even if the upper frequency correction is turned way up in the circuit of FIG. 4, the acoustic output of the real load does not become unnaturally brighter or shriller, but still accurately represents voice timbre and high harmonic-containing tinkly sounds of such instruments as bells, chimes and cymbals. The circuit of FIG. 4 has the still further important advantage that the output of its summing amplifier 104 is not load-sensitive. The harmonic distortion for the circuit of FIG. 4 is approximately the same as for the circuits of FIGS. 1–3.

Figure 5:
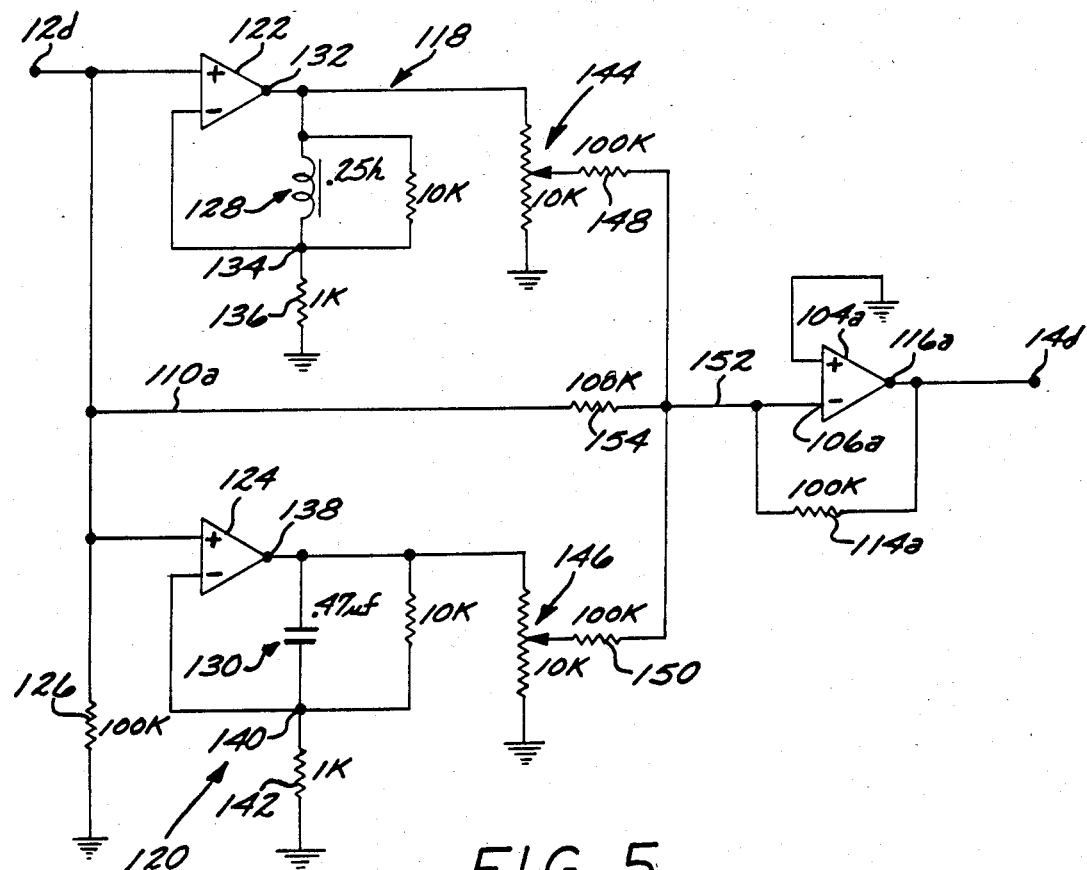
FIG. 5 is a circuit diagram illustrating a further form of the invention in which separate high and low frequency channels contain respective separate inductor and capacitor reference load components.

Referring now to FIG. 5, the reference load correction system shown in this figure includes separate high frequency and low frequency reference load correction circuit portions 118 and 120, respectively, each of which has its own respective balanced differential operational amplifier 122 and 124. The program input terminal 12d is connected, through input resistor 126, to the noninverting input of each of the differential amplifiers 122 and 124. The high frequency differential amplifier 122 uses an inductor component reference load 128 and the low frequency differential amplifier 124 uses a capacitor component reference load 130, with the crossover frequency for the reference loads 128 and 130 still at 400 Hz. The output 132 of amplifier 122 is connected to one side of the inductor component reference load 128, while the other side of reference load 128 is connected to sensing point 134, which is in turn connected both to sensing resistor 136 and to the inverting input of amplifier 122. Similarly, the output 138 of amplifier 124 is connected to one side of the capacitor component reference load 130, the other side of which is connected to sensing point 140, the sensing point 140 in turn being connected to sensing resistor 142 and to the inverting input of amplifier 124.

Separate high and low frequency correction signals are provided at the respsective amplifier outputs 132 and 138, and these are mixed through respective individual gain control potentiometers 144 and 146 with the original program into a summing amplifier 104a. The outputs of the respective high and low frequency correction signal gain control potentiometers 144 and 146 are connected through respective summing resistors 148 and 150 to a summing bus 152 that is connected to the inverting input 106a of summing amplifier 104a. Flat, full, undistorted program signal is conducted from program input terminal 12d through a conductor 110a and summing resistor 154 to the summing bus 152. Thus, the separately adjustable high and low frequency correction signals are mixed with the original program signal in the summing bus 152 and summing amplifier 104a. Preferably, the feedback resistor 114a connected between the output 116a and inverting input of summing amplifier 104a has the same value as each of the summing resistors 148, 150 and 154 for a one-to-one gain for each of the mixed signals. The output 116a of summing amplifier 104a is connected to the system output 14d, which in turn is adapted to be connected to a power amplifier and load combination.

The circuit of FIG. 5, while containing the desirable feature of independent adjustability of the high and low frequency corrections, has the rapid rise time and slightly leading phase all the way out to 20 KH$_z$ of the circuit of FIG. 4. Correction adjustment in the circuit of FIG. 5 has been found to not change the phase or rise time. The harmonic distortion is reduced to approximately 0.4 percent, which is only about half that of the previously described circuits.

Figure 6:
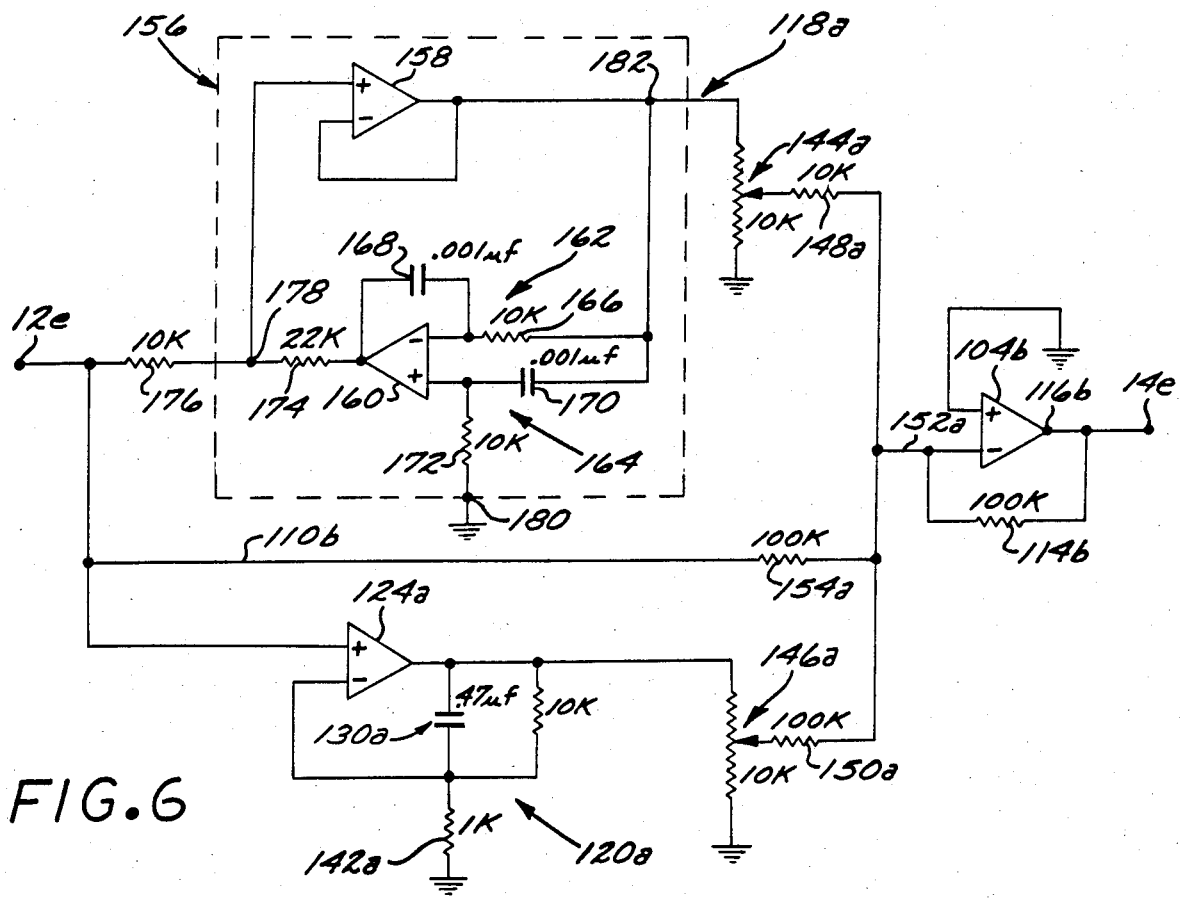
FIG. 6 is a circuit diagram illustrating another form of the invention also having separate channels, but in which the high frequency channel correction signal is developed in a divider network containing an active inductor.

The form of the invention illustrated in FIG. 6 has, as does the form of FIG. 5, three separate channels, high and low frequency correction channels, and a straight-through program signal channel. In the form of FIG. 6, the low frequency correction channel and the program signal channel are the same as in the circuit of FIG. 5, but the high frequency channel employs as the inductor component an "active inductor" in a voltage divider circuit arrangement that produces the high frequency amplitude and phase correction signal without requiring the preparation of a feedback signal or the comparison of such a feedback signal with the incoming program signal as required for the high frequency correction in the previously described forms of the invention.

In FIG. 6, the program voltage signal is introduced at program input terminal 12e and is fed to separate high and low frequency reference load correction circuit portions 118a and 120a, respectively. As in the FIG. 5 form of the invention, the low frequency correction circuit portion 120a includes a balanced differential operational amplifier 124a which drives a capacitor component reference load 130a to develop the required low frequency voltage feedback signal across sensing resistor 142a and deliver this feedback voltage signal to the inverting input of the differential amplifier 124a. The low frequency correction signal is delivered from the output of differential amplifier 124a through gain control potentiometer 146a and summing resistor 150a to summing bus 152a.

As in the circuit of FIG. 5, the flat, unattenuated program voltage signal is delivered from program input terminal 12e through conductor 110b and summing resistor 154a to the summing bus 152a.

The high frequency reference load correction circuit portion 118a in the FIG. 6 form of the invention utilizes as the inductor component an active inductor in a voltage divider circuit arrangement which produces a high frequency correction signal essentially the same as the high frequency correction signal produced in the FIG. 5 form of the invention, but is produced without the FIG. 5 feedback and comparison with the incoming program signal. The active inductor is shown enclosed in the dotted line block and is generally designated 156. A conventional inductor could be employed in the same circuit position as the active inductor 156 in FIG. 6, but the active inductor is preferred because it functions as a perfect inductor that has no resistance. The active inductor 156 is a type of circuit well known in the art, so the detailed operation of its individual parts does not form a part of the present invention. It includes back-to-back differential operational amplifiers 158 and 160, the amplifier 160 having phase shifting networks 162 and 164 associated with its respective inverting and noninverting inputs, the phase shifting network 162 consisting of a resistor 166 and capacitor 168, and the phase shifting network 164 consisting of a capacitor 170 and resistor 172. The active inductor amplifier 160 has an output resistor 174.

The voltage divider of which the active inductor 156 is a part includes a resistor 176 as the upper part of the voltage divider, the resistor 176 being connected at its upper end to program input terminal 12e and at its lower end to the active inductor 156 at a junction 178. The active inductor 156 is the lower part of the voltage divider, extending from the junction 178 to a ground connection 180. The output from this voltage divider consisting of resistor 176 and active inductor 156 is taken from a junction 182 at the output of amplifier 158. The output point 182 will correspond in amplitude and phase to the voltage divider junction point 178, because the amplifier 158 is arranged as a unity gain, noninverting voltage follower.

The amplitude of the high frequency correction signal is made adjustable by being taken off of the junction point 182 through gain control potentiometer 144a, and the high frequency correction signal is delivered through a summing resistor 148a to the summing bus 152a. The summing bus 152a delivers the high and low frequency correction signals and the program signal to summing amplifier 104b, the output 116b of which is connected to the system output terminal 14e that is adapted to be connected to a power amplifier and load combination.

The gain on the three channels in the summing amplifier 104b is the value of the amplifier feedback resistor 114b divided by the value of the respective channel summing resistor 148a for the high frequency channel, 150a for the low frequency channel, and 154a for the program channel. Inasmuch as the voltage divider arrangement of the high frequency channel causes its correction signal to be considerably lower in amplitude than the correction signal of the low frequency and program channels, the summing resistor 148a for the high frequency channel has a much lower value than the summing resistors for the low frequency and program signal channels, as for example in a ratio of one to ten, so as to provide a balanced output between the three channels.

The active inductor high frequency channel reference load operates in the following manner to provide the high frequency correction signal. At the 400 Hz crossover frequency, the active inductor 156 of the high frequency channel 118a and the capacitor component reference load 130a of the low frequency channel 120a balance so as to cancel. As program frequency rises above the 400 Hz crossover frequency, the active inductor 156 increases more and more in impedance, so that it occupies an increasingly larger proportion of the voltage drop in the voltage divider arrangement with resistor 176, to produce an increasingly higher correction signal voltage output at the junction point 182 and hence through the gain control potentiometer 144a and summing resistor 148a to the summing bus 152a and summing amplifier 104b. The continuous, instantaneous nature of the correction signal, with its fast rise time that is faster than the audible harmonics, causes the high frequency correction signal output from the voltage divider output junction point 182 to have a slightly leading phase relative to the program signal all of the way up from the 400 Hz crossover frequency to 20 KH$_z$. The phase of the high frequency correction signal is a leading phase, being essentially the continuous, instantaneous complement of the phase lag caused by the active inductor 156.

The reference load correction circuit of FIG. 6 has exhibited a much lower harmonic distortion than the previously described correction circuits, on the order of 0.1 percent, improved rise time of from about 2 to about 3 microseconds, and does not cause any change in phase correction or rise time with adjustments of the amount of correction in the respective high and low frequency channels 118a and 120a.

Figure 7:
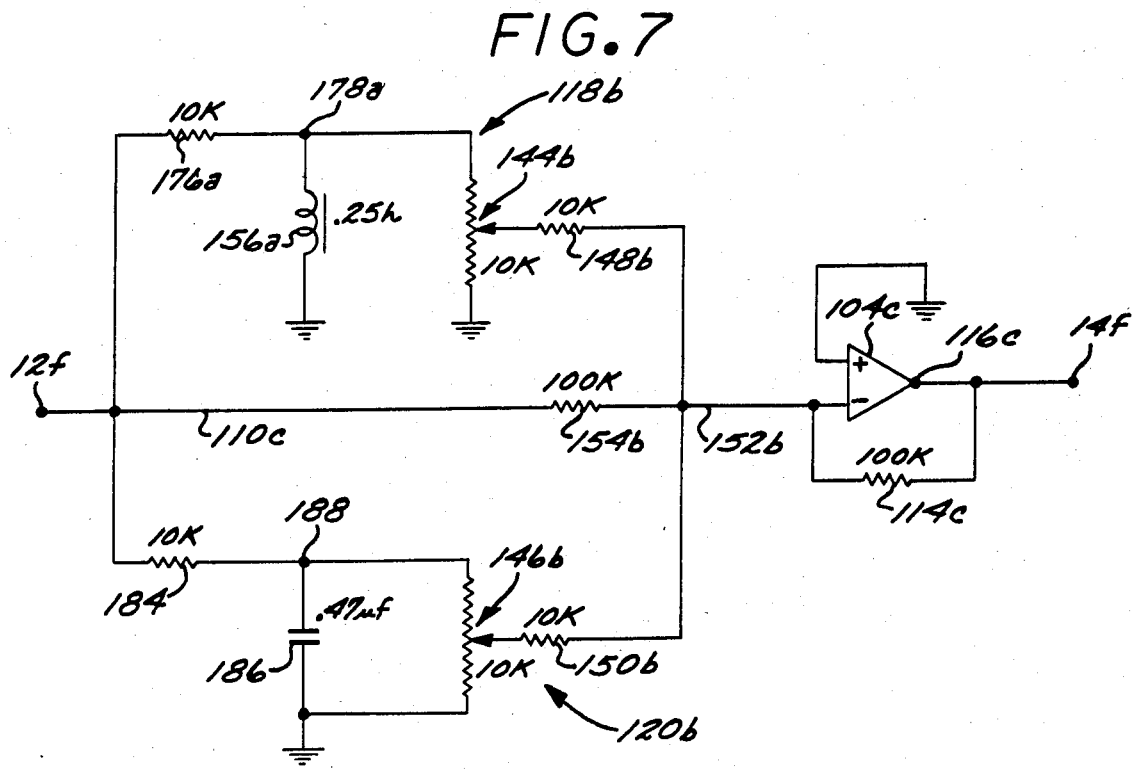
FIG. 7 is a circuit diagram illustrating another form of the invention which has separate high and low frequency channels in which the respective high and low frequency correction signals are derived from voltage dividers containing the respective inductor and capacitor reference load components.

In the reference load correction system illustrated in FIG. 7, separate high and low frequency channels 118b and 120b are employed as they are in the systems of FIGS. 5 and 6, but the reference loads for the separate high and low frequency channels are each arranged in a voltage divider configuration similar to the high frequency channel voltage divider configuration of FIG. 6. If desired, the high frequency correction channel 118b of the FIG. 7 system can be made identical to the high frequency correction channel 118a of FIG. 6, employing the active inductor 156 of FIG. 6. However, to illustrate the high frequency channel inductor component voltage divider arrangement in a simpler form, a real inductor 156a has been shown as the inductor component in FIG. 7 instead of the active inductor 156.

The high frequency channel voltage divider in FIG. 7 consists of resistor 176a and inductor component 156a connected between program input terminal 12f and ground. The high frequency correction signal output is from the junction 178a between the voltage divider components 176a and 156a, and is fed through gain control potentiometer 144b and summing resistor 148b to summing bus 152b and thence to summing amplifier 104c. This high frequency correction channel 118b of FIG. 7 operates in exactly the same way as the high frequency correction channel 118a of FIG. 6.

The low frequency correction channel 120b of FIG. 7 includes a voltage divider between program input terminal 12f and ground consisting of a resistor 184 and a reference load capacitor component 186. The output junction 188 from this reference load divider provides its low frequency correction signal through gain control potentiometer 146b and summing resistor 150b to summing bus 152b and thence to summing amplifier 104c.

The flat, unattenuated program signal is delivered from program input terminal 12f through conductor 110c and summing resistor 154b to summing bus 152b and thence to summing amplifier 104c. The mixed high and low frequency correction signals and program signal are delivered from the output 116c of summing amplifier 104c to the system output 14f which is adapted to be connected to a power amplifier and load combination.

Because of attenuation in the voltage dividers of both the high frequency correction channel 118b and the low frequency correction channel 120b, the respective summing resistors 148b and 150b for the high and low frequency channels are made much smaller than the feedback resistor 114c in summing amplifier 104c and the summing resistor 154b in the program channel conductor 110c. This causes the correction signals from both the high frequency correction channel 118b and the low frequency correction channel 120b to be amplified to correct proportions relative to the program signal.

The reference load inductor component 156a in high frequency correction channel 118b and the reference load capacitor component 186 in the low frequency correction channel 120b are balanced to cancel at the 400 $H_z$ crossover frequency. The capacitor component reference load voltage divider in the low frequency channel 120b operates in the same manner as the inductor component refernece load voltage dividers in the high frequency channels of both FIG. 6 and FIG. 7, except that it operates in the opposite frequency direction for frequency reductions below 400 $H_z$. Thus, as the frequency drops below 400 $H_z$, the impedance of reference load capacitor component 186 increases, so that the proportion of voltage drop across capacitor 186 increases relative to the overall voltage drop across the divider that includes resistor 184 and capacitor 186, resulting in increased correction signal output delivered from the voltage divider junction 188 to gain control potentiometer 146b and thence through summing resistor 150b and summing bus 152b to summing amplifier 104c. The phase of the low frequency correction signal produced at the voltage divider junction 188 is a lagging phase, being essentially the continuous, instantaneous complement of the phase lead caused by the capacitor component 186 as such capacitor component phase varies over the low frequency range. Thus, the leading capacitor component phase relative to the program signal will cause the low frequency correction signal to lag in phase relative to the program signal. This phase-lagging correction voltage signal will compensate for the leading phase that otherwise would be produced at low frequencies by capacitive reactance in the real load. In the same manner, but conversely, the high frequency correction voltage from high frequency channel 148b has a leading phase to compensate for the phase lag that would otherwise be caused at high frequencies by the inductive reactance of the real load.

In the load correction system of FIG. 7, the input divider resistors 176a and 184 set the respective slopes of the high and low frequency portions of the correction signal curve of FIG. 10. The heights of the respective high and low frequency portions of the curve are adjustably established by the settings of the respective gain control potentiometers 144b and 146b. In the system of FIG. 6, the slope of the high frequency portion of the curve is set by the input divider resistor 176, while the slope of the low frequency portion of the curve is set by the sensing resistor 142a. The heights of the high and low frequency portions of the curve are adjustably set by the respective gain control potentiometers 144a and 146a. In the system of FIG. 5, the slopes of the high and low frequency portions of the curve are set by the values of the respective sensing resistors 136 and 142, while the heights of the high and low sections of the curve are adjustably set by the respective gain control potentiometers 144 and 146. In the system of FIG. 4, the slopes of both the high and low frequency portions of the curve are set by the single sensing resistor 34c, while the heights of the high and low portions of the curves are independently adjustable by the variable shunt resistors across the respective inductor and capacitor components of the reference load 30c, and the heights of both curves are jointly adjustable by the single gain control potentiometer 102.

Figure 8:
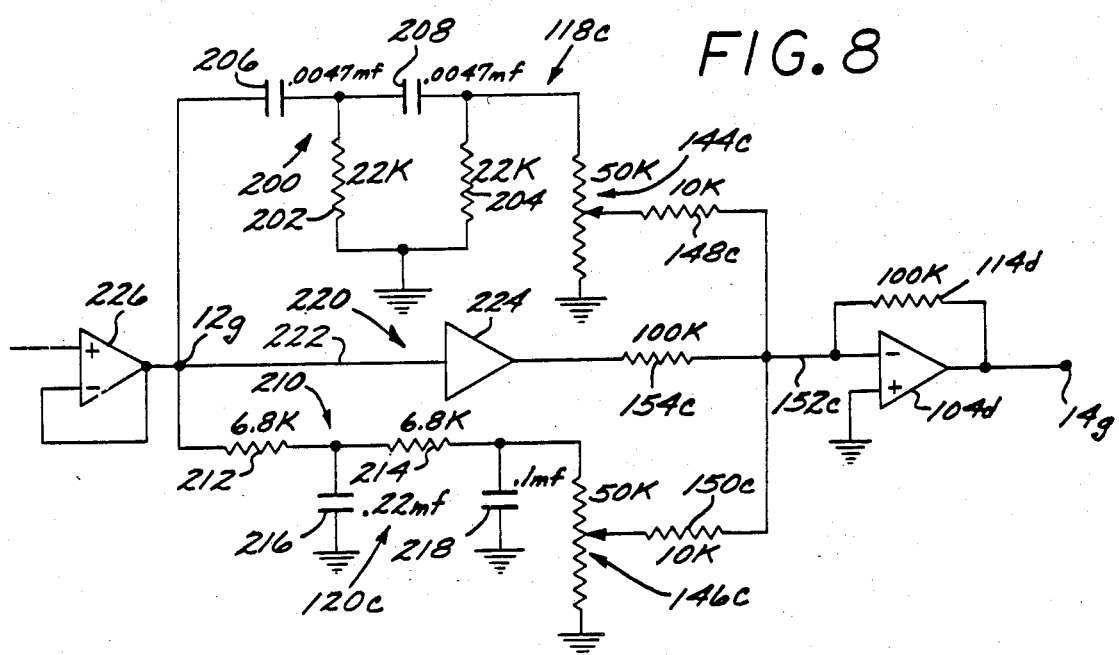
FIG. 8 is a circuit diagram illustrating a further form of the invention which has separate high, midrange and low frequency channels and in which the inductor and capacitor reference load components in the respective high and low frequency channels are simplified RC phase shifting networks.

The performance of the FIG. 7 form of the invention is substantially the same as the performance of the FIG. 6 form of the invention, with a rise time in the range of from about 2 to about 5 microseconds, a leading phase above the 400 $H_z$ crossover frequency all of the way out to 20 $KH_z$, and the adjustments not disturbing either phase or rise time. As with the FIG. 6 form, the system of FIG. 7 has a very low harmonic distortion of about 0.1 percent. The harmonic distortion perviously noted for the circuits of FIGS. 1-5 appeared to be principally a distortion of the third harmonic however, such distortion is substantially eliminated in the FIG. 6 and FIG. 7 forms of the invention. FIG. 8 illustrates another simplified form of the present invention which has separate high and low frequency channels in a manner similar to the circuits of FIGS. 5, 6 and 7. However, the circuit of the form of the invention illustrated in FIG. 8 has several features which are improvements over the circuits of FIGS. 5, 6 and 7. First, the inductor and capacitor reference load components in the respective high and low frequency channels of FIG. 8 are simplified RC (resistor and capacitor) phase shifting networks which shift the phases of the high and low frequency portions of the audio spectrum in the appropriate directions and are at the same time amplitude responsive to frequency generally in the same manner as the inductor and capacitor components of the other forms of the invention. The RC circuit-type inductor component of the FIG. 8 embodiment enables the undesirable bulk and high cost of the real choke inductors of FIGS. 5 and 7 or the added circuit complexity of the active inductor of FIG. 6 to be eliminated, and this enables the circuit of FIG. 8 to be embodied in a small hybrid IC (integrated circuit) chip. Another difference between the circuit of FIG. 8 and the circuits of FIGS. 5, 6 and 7 is that in FIG. 8 the reference load inductor component in the high frequency channel and the reference load capacitor component in the low frequency channel are respective high and low pass filters, and instead of the straight-through full program signal channels 110a, 110b and 110c of FIGS. 5, 6 and 7, respectively, the circuit of FIG. 8 has a midrange band pass filter in this same, center channel. With the high, low and midrange frequencies thus separated in the circuit of FIG. 8, the highs and lows can be amplitude adjusted for the desired balance relative to the midrange. Applicant has found that excellent performance is obtained with a midrange band pass filter having its response centered at 400 $H_z$ and with corner frequencies at approximately 700 and 200 $H_z$ (corner frequencies being the 3 DB drop points); with the high pass filter and phase shifter rising above the midrange center level at approximately 1 $KH_z$ at a slope adjustable up to a maximum of approximately 6 DB per octave; with the low pass filter and phase shifter rising above the center level of the midrange band pass at approximately 300 $H_z$ at a slope adjustable up to approximately 6 DB per octave and then leveling off around approximately 200 $H_z$ and being substantially flat all the way down to below 20 $H_z$; and with the reference load inductor component 200 and capacitor component 210 being balanced to cancel at the 400 $H_z$ crossover frequency. This results in a substantially flat overall response from approximately 20 $H_z$ all of the way up to approximately 20 $KH_z$.

Referring now to the specific details of the circuit shown in FIG. 8, the high and low frequency correction channels are generally designated 118c and 120c, respectively, and they are arranged as parallel circuits between the input junction 12g and the output summing bus 152c.

The reference load inductor component in high frequency channel 118c is generally designated 200, and in this form of the invention it is a passive high pass filter and phase shifter which produces a leading phase for the high frequency part of the spectrum, and causes both the phase lead and the amplitude of the highs to increase with frequency from approximately 1 $KH_z$ all of the way up to at least approximately 20 $KH_z$, so as to compensate for the inductive reactance lag, frequency response characterstics and inertia characteristics of the load. This passive high pass filter and phase shifter 200 consists of a pair of resistors 202 and 204 and a pair of capacitors 206 and 208. The output of this reference load inductor component 200 is through a manual gain control potentiometer 144c and summing resistor 148c to the summing bus 152c.

The low frequency correction channel 120c has its reference load capacitor component 210 in the form of a passive low pass filter and phase shifter which produces a phase lag in the low frequency signal and causes both this phase lag and the amplitude of the low frequency signal to increase as frequency decreases from approximately 300 $H_z$, so as to compensate for the capacitive reactance load and frequency response characteristics of the load. This passive low pass filter and phase shifter, which is the reference load capacitor component 210, consists of a pair of resistors 212 and 214 and a pair of capacitors 216 and 18. The output of low frequency correction channel 120c is through manual gain control potentiometer 146c and summing resistor 150c to the output summing bus 152c. The reference load inductor component 200 and reference load capacitor component 210 are balanced to substantially cancel at the 400 $H_z$ crossover frequency.

The midrange channel, generally designated 220, also is arranged as a parallel circuit with the high frequency channel 118c and low frequency channel 120c between the input junction 12g and the output summing bus 152c. Midrange channel 220 includes conductor 222 and an operational amplifier 224 in a midrange band pass filter configuration. The output of band pass filter 224 is taken through a summing resistor 154c to the output summing bus 152c.

The input to the input junction 12g is through a voltage follower 226 having a very low output impedance for impedance matching with the three parallel circuits 118c, 120c and 220. The summing bus 152c feeds into summing amplifier 104d which has feedback resistor 114d, the output of summing amplifier 104d being connected to the system output 14g. The gain of each of the three channel signals in summing amplifier 104d is the ratio of the value of feedback resistor 114d to the value of the respective channel summing resistors 148c, 150c and 154c.

Figure 9:
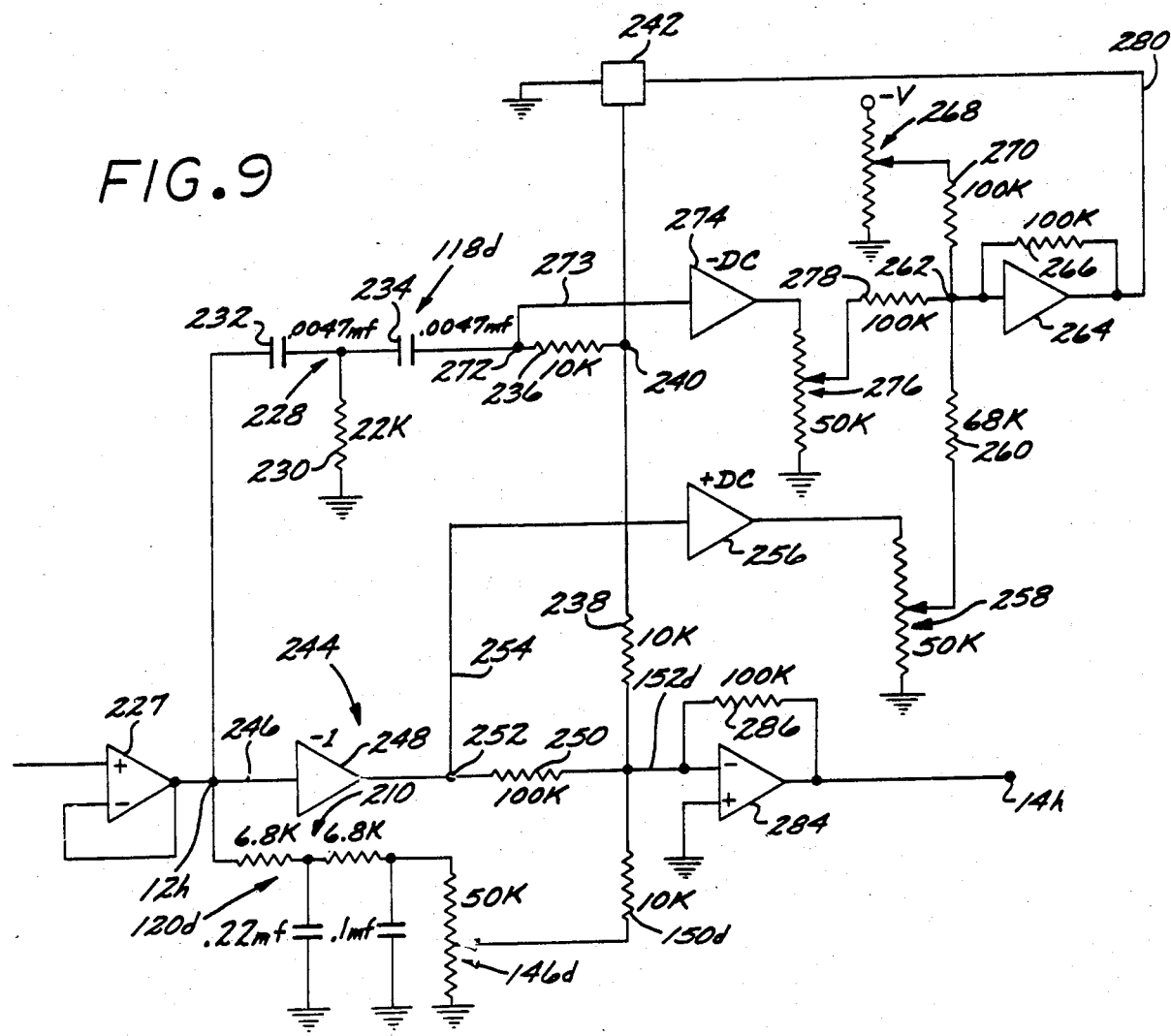
FIG. 9 is a circuit diagram illustrating a still further form of the invention which also has separate high, midrange and low frequency channels, but which additionally has a circuit system which automatically readjusts the amplitude of the high frequency signal relative to that of the midrange signal to maintain a desired amplitude balance, and which has a phase inverter in the midrange channel that gives the high frequency channel signal a 180° phase lead over the midrange channel signal.

The high frequency harmonics, in general, are the harmonics of fundamentals in the midrange frequency band, and the ability to adjust the amplitude of the high frequencies relative to the midrange frequencies with the gain control potentiometer 144c in high frequency channel 118c enables an optimum balance to be achieved between the amplitude of the high frequency and the amplitude of the midrange fundamentals of such harmonics for best unmasking of the high frequency harmonics and transients. The circuit of FIG. 9 provides for automatic adjustment of this balance between the highs and the midrange frequencies as this balance deviates from a desired preset balance according to variations in the program. The performance of the FIG. 8 form of the invention is substantially the same as the performance of the forms of the invention illustrated in FIGS. 6 and 7, with a rise time in the range of from about 2 to about 5 microseconds, a leading phase above the 400 $H_z$ crossover frequency all of the way out to 20 $KH_z$, and the adjustments in the circuit not disturbing either phase or rise time. As with the forms of FIGS. 6 and 7, the circuit arrangement of FIG. 8 has a very low harmonic distortion of not more than about 0.1 percent.

Referring now to FIG. 9, the input to input junction 12h is through a voltage follower 227 for impedance matching. High frequency correction channel 118d and low frequency correction channel 120d are connected in a parallel circuit arrangement between the input junction 12h and output summing bus 152d. The low frequency correction channel 120d is the same as the low frequency correction channel 120c in FIG. 8, having reference load capacitor component 210 in the form of a passive low pass filter and phase shifter, with the output from low frequency correction channel 120d being through manual gain control potentiometer 146d and summing resistor 150d to the output summing bus 152d.

The reference load inductor component 228 in the high frequency correction channel 118d is an RC network that produces a phase lead which, along with amplitude, increases with frequency from approximately 1 KH$_z$ all of the way out to 20 KH$_z$. This RC network of the high pass filter and phase shifter reference load inductor component 228 consists of a resistor 230 and a pair of capacitors 232 and 234. The output of inductor component network 228 passes through a summing or gain set resistor pair 236 and 238 which may be considered as a split resistor divided at an intermediate junction point 240. The resistor 238 is connected to the output summing bus 152d. An automatically variable resistor 242, preferably an FET (field effect transistor), is connected between such junction point 240 and ground for varying the effective resistance of the summing gain set resistor pair 236 and 238 so as to automatically balance the amplitude of the high frequencies relative to the midrange frequencies. This is to compensate automatically for programs being played that are either over-equalized or underequalized in the high frequency signal range, either during the entire program or during some portions of the program. This automatic compensation thus automatically mixes the program in the proper manner for a correct, preset balance between the high range and the midrange. Details of the automatic compensation circuit will be described hereinafter.

As in the other forms of the invention described above, the reference load inductor component 228 and reference load capacitor component 210 are balanced to substantially cancel at the 400 H$_z$ crossover frequency.

The midrange channel is generally designated 244, its conductor 246 being connected to the input junction 12h and leading to midrange band pass filter 248 having substantially the same frequency response characteristics as the midrange band pass 224 of FIG. 8, but in this case the band pass filter 248 is also an inverter to separate the high frequency signal from the midrange signal by 180° as discussed more in detail hereinafter. The output of midrange band pass and inverter 248 goes through summing resistor 250 to the output summing bus 152d.

The automatic system in the circuit arrangement of FIG. 9 for adjusting the amplitude balance between the output of high frequency correction channel 118d and midrange channel 244 is a detector and summing system wherein a negative DC output detector senses the high frequency signal in high frequency channel 118d and produces a DC voltage analog representative of the average high frequency amplitude, a positive DC output midrange detector senses the signal in midrange channel 244 and produces a DC analog output representing the average amplitude of the midrange signal, and the minus and plus DC outputs of the respective high and midrange detectors are mixed in a summing amplifier, the DC output of which automatically adjusts the variable resistor 242. A more detailed description of how this dual detector and summing amplifier circuit system works will be provided in connection with the detailed description of the circuitry itself.

The source of unattenuated midrange signal for this circuit system is a junction point 252 in the midrange channel conductor 246 at the output of midrange band pass 248. A conductor 254 leads from junction point 252 to the midrange detector 256, which is a rectifier giving an output that is an average DC of the program midrange frequencies. The positive DC output of detector 256 goes through a gain adjust potentiometer 258 which is the main adjust for the system, and then through a summing resistor 260 to an input junction 262 for a summing amplifier 264 that has a feedback resistor 266. The ratio of the value of feedback resistor 266 to the value of summing resistor 260 determines the gain which the summing amplifier 264 applies to the midrange DC. Summing amplifier 264 is negatively biased at its input junction 262 from a potentiometer 268 through a resistor 270, the amount of this negative bias varying according to the type of FET employed for the variable resistor 242; typically this will be on the order of about 3 volts.

The source of high frequency signal is a junction point 272 in the high frequency correction channel 118d between capacitor 234 and resistor 236. By placing the junction point 272 at this location, it provides a source of unattenuated high frequency signal through a conductor 273 to the high frequency detector 274, which is a negative output rectifier providing a negative DC voltage that is the analog of the average amplitude of the high frequencies. This negative DC output goes through a preset trimmer potentiometer 276 and a summing resistor 278 to the input junction 262 of DC summing amplifier 264. The gain provided to this high frequency range negative DC voltage by summing amplifier 264 is the ratio of the value of its feedback resistor 266 to the value of high frequency summing resistor 278.

The sum output of summing amplifier 264, containing positive DC information from midrange detector 256 and negative DC information from high range detector 274, passes through a conductor 280 to the FET 242 which is in a variable resistor configuration. The FET circuit is arranged so that an increase in the output voltage of summing amplifier 264 increases the resistance of variable resistor 242, while a decrease in the DC voltage output of summing amplifier 264 decreases the resistance of the variable resistor 242. The manner in which this provides for automatic adjustment of the balance between the high and midrange frequency portions of the program is as follows.

The variable resistor FET 242 forms a voltage divider to the junction point 240 in the middle of the divided gain set resistor 236–238, so that as the FET's resistance goes up and down, it allows, respectively, more or less signal to go into the primary summing amplifier 284 from the high frequency correction channel 118d. If the average amplitude of the program midrange frequencies comes up relative to the average amplitude of the program high frequencies, then the positive DC output of midrange detector 256 rises relative to the negative DC output of high range detector 274, and the DC output of summing amplifier 264 will rise accordingly and cause an increase in the resistance of variable resistor 242, increasing the gain of the high frequency channel 118d. Conversely, if the average amplitude of the high frequency signal rises relative to the average amplitude of the midrange signal, then the negative DC output of high frequency detector 274 increases, causing a reduction in the DC output voltage of summing amplifier 264, and a resulting decrease in the resistance of the FET variable resistor 242, which decreases the gain of the high frequency channel 118d. In this manner, the system will continuously and automatically seek a proper balance between the high and midrange portions of the program, according to the settings of main adjust potentiometer 258 and high frequency preset trimmer potentiometer 276.

It will thus be seen that the midrange portion of this automatic balancing system functions in the manner of an expander, since it increases the gain of the high frequency channel 118d to match increases in the average amplitude of the midrange frequencies. Conversely, the high frequency portion of the balancing system functions in the manner of a compressor, since it decreases the gain of the high frequency channel 118d to compensate for increases in the average amplitude of the high frequency signal. Thus, the overall balancing system functions in the manner of a compander.

The automatic amplitude balancing between the midrange and high frequency signals is important because of the fact described above in connection with FIG. 8 that the high frequency harmonics, in general, are the harmonics of fundamentals in the midrange frequency band, and with the high and midrange frequencies thus closely related, the amplified program is more real if they are maintained in proper balance. Although in prototype circuitry a similar automatic balancing was provided in the low frequency channel, this did not improve the amplified program output sufficiently to warrant the extra complication and expense.

The reason for the phase inversion in the midrange channel 244 provided by the midrange band pass filter and inverter 248 is to set the high frequency harmonics and transients out to the ear before the onset of hearing the midrange frequencies and thereby substantially completely unmask the high frequencies from the midrange frequencies. Thus, in the circuit arrangement of FIG. 9, the high frequencies are leading in phase much further than they were in the other forms of the invention as described above, and this has been found in practice to give better separation and better details of the high frequencies from the midrange frequencies. This phase lead of the highs relative to the midrange frequencies is accomplished by inversion of the midrange channel 244 rather than inversion of the high frequency channel 118d to eliminate the need for an extra operational amplifier since the operational amplifier 248 serves the dual purposes of band pass filter and inverter, whereas a separate operational amplifier would have been required in the high frequency channel 118d. Nevertheless, alternatively the same phase separation between highs and midrange frequencies may be accomplished by providing an inverter in the high frequency channel 118d. Although inversion of the midrange channel 244 will probably cause some separation of the low frequencies in the low frequency channel 120d, this does not seem to be audibly detectible in practice.

The correct balancing between high frequencies and midrange frequencies and the large phase lead introduced in the high frequencies relative to the midrange frequencies improves the high frequency detail so much that there may be a psychological feeling of having lost something in the base frequency range. This can be compensated for by adjusting the potentiometer 146d in low frequency channel 120d to raise the gain of the low frequency channel.

Aside from the automatic balancing between the high pass channel 118d and midrange band pass channel 244, the frequency response characteristics for all three channels are substantially the same for the circuit of FIG. 9 as for the circuit of FIG. 8. Also, aside from the results of the midrange channel inversion, the performance of the circuit of FIG. 9 is at least as good as that of the circuits of FIGS. 6, 7 and 8 as to rise time and low harmonic distortion.

FIG. 10 shows a correction signal amplitude vs. frequency curve which is typical for the reference load correction systems of the invention illustrated in FIGS. 4–9. The curve will be similar for the systems of FIGS. 1-3, but the high frequency portion of the curve will not normally be brought up so high for the systems of FIGS. 1-3 because of the distortions referred to hereinabove that are introduced if the Q of the inductor component part of the reference load is turned up too high. By way of comparison, the curve shown in FIG. 11 is an impedance/frequency response curve given by a manufacturer for a typical speaker rated 8 ohms at 400 $H_z$, this curve illustrating some of the serious problems inherent in conventional speakers that are corrected by the reference load correction circuits of the present invention.

Referring at first to FIG. 10, the correction signal curve is generally designated 190, and includes high frequency portion 192 above the 400 $H_z$ crossover frequency and low frequency portion 194 below the 400 $H_z$ crossover frequency. At 400 $H_z$ there is no correction signal, and both the high frequency portion 192 and the low frequency portion 194 of curve 190 rise tangentially from the 400 $H_z$ zero point on the curve 190.

The high frequency portion 192 of curve 190 gradually slopes upwardly from the 400 $H_z$ point, and rises between about 4 and 6 decibels per octave starting at about 1,000 $H_z$ up through about 10. $KH_z$, where the curve starts to roll off, the curve going nearly flat at 20 $KH_z$. Above 20 $KH_z$ additional correction does not contribute significantly to the sound.

The low frequency portion 194 of curve 190 gradually rises below 400 $H_z$ to a slope of about 3 decibels per octave, up to about 40 $H_z$, and then rolls off and levels out all of the way down to about 5 $H_z$.

Referring to FIG. 11, the impedance curve generally designated 196 represents total speaker impedance. Above about 400 $H_z$ this impedance is the vector sum of resistance and inductive reactance; while below about 400 $H_z$ this impedance is the vector sum of resistance and some capacitive reactance of the speaker coil, but primarily a capacitive reactance effect caused by the compliance and open air cone resonance of the speaker. It will be noted from the total impedance curve 196 that the manufacturer's rating for the speaker of 8 ohms only holds approximately true within a very limited frequency range of from about 150 $H_z$ to about 600 $H_z$, and that both above and below this very limited range, the total impedance of the speaker rises to much higher values. Thus, because of the inductive reactance of this load, its impedance doubles to 16 ohms at approximately 2300 $H_z$, and quadruples to 32 ohms at about 10

KH$_z$. Below about 150 ohms, the impedance curve 196 rises sharply to an impedance peak caused primarily by the cone resonance of the speaker, and then slopes back down sharply to 8 ohms at 20 H$_z$.

Since power delivered to a speaker from an amplifier, and hence acoustic output of the speaker, is inversely proportional to speaker impedance, it will be apparent from the speaker impedance curve 196 of FIG. 11 that above 400 H$_z$ the higher frequencies in the amplifier program will be greatly reduced in acoustic ouput relative to the lower frequencies, so that much of the overtone structure will be reduced or lost, and the formant structure of the program will be considerably adversely affected. In addition to the serious amplitude losses of the program, the inductive reactance of the speaker causes large phase lags in the load current relative to the program voltage, and such phase lags greatly increase at the higher frequencies. Thus, the phase lag angle of the load current caused by the inductive reactance of the speaker represented by the impedance curve 196 is approximately 33° at 400 H$_z$, approximately 45° at 900 H$_z$, and as high as approximately 70° at 5 KH$_z$. Such phase lag angles of the load current relative to the program signal are directly responsible for transient distortion referred to hereinabove in which the fundamental and lower harmonic frequencies mask the high frequency harmonics. The rising part of impedance curve 196 below 400 H$_z$ caused by speaker compliance and cone resonance has a leading phase, which normally will make the masking problem even worse.

The general similarity between the correction signal curve 190 of FIG. 10 provided by the present invention and the typical total speaker impedance curve 196 of FIG. 11 is to be noted. The high frequency portion 192 of the correction signal curve of FIG. 10 rises at a rate sufficient to substantially completely overcome the increase of impedance with frequency of the speaker as illustrated in the rising part of the speaker impedance curve 196 in FIG. 11. As described in detail hereinabove, the reference load correction signal provided by the present invention substantially completely corrects for the speaker phase lags indicated in FIG. 11, and the circuits of the present invention illustrated in FIGS. 4–8 will actually cause a slightly leading load current phase relative to the phase of the program signal voltage from the 400 H$_z$ crossover frequency all of the way out to 20 KH$_z$, assuring that the acoustic output of the speaker will be essentially in phase over this entire frequency spectrum. Additionally, the circuit illustrated in FIG. 9 will provide a large amount of phase lead for the high frequency harmonics relative to the midrange frequencies to highlight the high frequencies, as described in detail above in connection with these FIG. 9.

The low frequency portion 194 of curve 190 shown in FIG. 10 does not completely compensate for the cone resonance peak, but the slope and height of the low frequency portion 194 of the curve are adjustable so that the low frequency acoustic output of the speaker or speaker system will sound good. Bringing the leveled part of the low frequency portion 194 of the curve all the way down below 20 H$_z$ assures that all of the percussion sounds will be clearly heard. A very important aspect of the reference load correction provided by the present invention in the low frequency portion 194 of curve 190 is that the low frequency correction signal has a phase lag, on the order of about 25° to 30°, which cancels the leading phase of the rising part of the cone resonance section of the speaker impedance curve.

While the reference load correction circuits embodying the present invention have been shown and described as being adapted to correct for speaker system loads, it is to be understood that the invention is equally adaptable to correct for the deficiencies of any amplifier-driven load, with the reference load circuit components being chosen as an equivalent model for the electrical and mechanical characteristics of the driven load, whatever that load may be.

In an early experimental prototype of the invention, an actual speaker load was employed as the reference load, and in other early prototypes, a passive reference load 30 in the FIG. 1 configuration was employed with inductor and capacitor circuit components having values selected to correspond approximately to the inductance and capacitance found in a real speaker load. However, experimentation with such early prototypes revealed that an inductor component of the reference load of the invention not only can serve as an equivalent model for the inductance of the real speaker load, but also as an analog model for the mechanical inertia of the speaker load. The current response curve in an inductor relative to the applied program voltage is closely analogous to the mechanical response curve of a speaker relative to the applied program. If a square wave voltage pulse is applied across an inductor, the current through the inductor will lag in phase at both the leading and trailing edges of the pulse; such leading edge phase lag corresponds to mechanical inertial lag, while such trailing edge phase lag corresponds to inertial overshoot. Advantage is taken of this correspondence between inductive reactance and inertia in the embodiments of the invention illustrated in FIGS. 1–9 by providing a large enough reference load inductor component to serve as an equivalent model for the inductance of the speaker system, and additionally to serve as an analog model for the mechanical inertia of the speaker system. Thus, the inductor circuit component of the reference load is selected so that the correction signal amplitude and power are sufficient to synergistically compensate substantially completely for both the inductive reactance and the mechanical inertia of the speaker system.

Similarly, the capacitor circuit component in the reference load of the present invention has been found to be capable of serving not only as an equivalent model for the capacitance of the real speaker system load, but also as an analog model for the compliance and related open air cone resonance of the speaker system, so that the low frequency correction signal provided by the invention serves not only to compensate for the capacitive reactance of the real load speaker system, but also synergistially compensates for the compliance and cone resonance of the speaker system.

In an amplifier load correction system such as that disclosed in Crooks U.S. Pat. No. 4,206,954 wherein corrections were made in response to sensing of the real transducer load current, where the load became more complex than a single speaker, as for example a plurality of speakers with crossover networks, or a multiple speaker distrubution line system, such system could mask the sensing and interfere with the correction. The reference load correction system employed in the present invention has been found to completely overcome this problem, and experimental prototypes of the invention have been tested with a wide variety of speaker systems of varying complexity and have been found to be completely compatible with all of them, substantially completely correcting for speaker system reactance and inertia in all cases.

Another problem in a direct load sensing system such as that of Crooks U.S. Pat. No. 4,260,954 that is completely cured by utilizing the reference load of the present invention is that a real load is unpredictable and often imperfect, while the reference load of the present invention is completely predictable and can serve as a substantially perfect model load. Thus, while the reference load of the present invention will correct for and substantially completely cure imperfections in the real load, when an imperfect real load is sensed as in the system of U.S. Pat. No. 4,260,954, the imperfection in the speaker system will not be corrected.

Another advantage of the reference load system of the present invention over a direct load sensing system such as that of U.S. Pat. No. 4,260,954 is that the reference load system is much simpler to hook up in any amplifier-speaker system, requiring only an input jack from the preamplifier and an output jack to the power amplifier, and not requiring the additional connections to the driven load as were required in the direct sensing type of system.

The reference load of the present invention is completely separated and isolated from the driven load, and as indicated in the preceding comparisons between the reference load system of the present invention and a direct load sensing system such as that of U.S. Pat. No. 4,260,954, it will be seen that this complete separation and isolation of the reference load from the real load is a critical factor in overcoming each of the problems of the direct load sensing type of system. In a test to illustrate the phase and transient correction characteristics of the present invention, separate, identical state-of-the-art speakers were connected to each of the two channels of a single power amplifier, and a graphic equalizer was employed to zero out the frequency responses of the speakers so that the acoustic output was flat in each of the two channels. An experimental prototype of the present invention was connected between the preamplifier and power amplifier in only one of the two channels. Upon switching back and forth between the channel without the reference correction system of the invention and the channel with the reference load correction system of the invention, the audible difference was dramatic. The channel with the reference load correction system sounded just like live sound, with no masking at all, even though the program was actually a recorded program; while the channel without the reference load correction system had a "recorded" sound with much of the high frequency transient content masked.

By way of example only and not of limitation, a type of operational amplifier that has proved to be satisfactory in the present invention is a 4558 dual operational amplifier such as that currently available as a standard chip from Motorola, National and Raytheon. This is a high performance operational amplifier with low noise and fast response characteristics. Also the TLO 62 operational amplifier from Texas Instruments has been found satisfactory. Also by way of example only and not of limitation, a part that has been found satisfactory for the variable resistor FET 242 of FIG. 9 is a Siliconics J 230FET.

The various circuit component values shown in the circuit diagrams of FIGS. 1-9 have been found to produce satisfactory results in experimental prototypes, but these also are given by way of example only and not of limitation.

Figure 12:
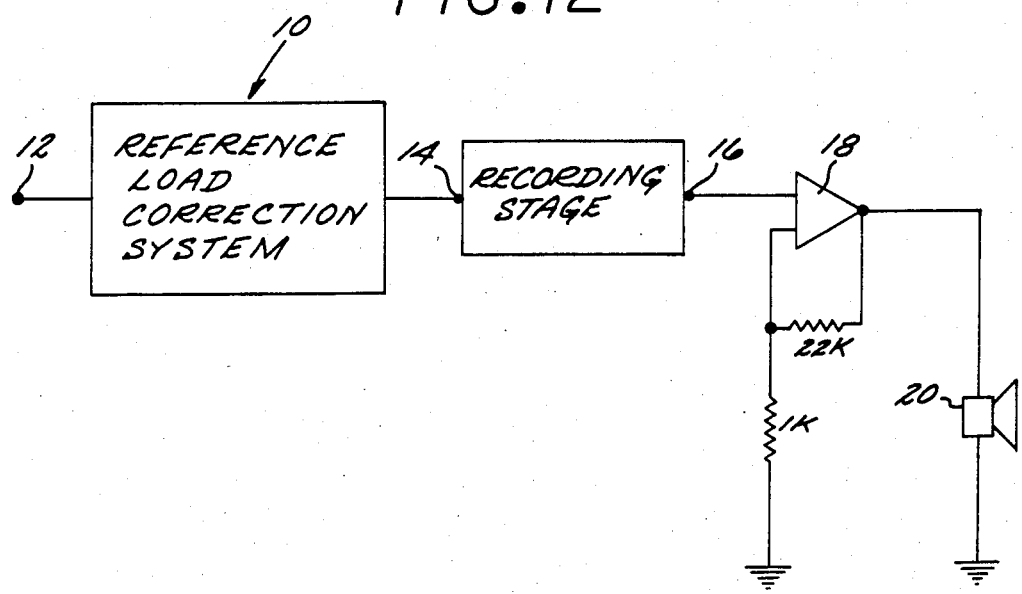
FIG. 12 is a block diagram, with some circuit components illustrated, of the circuit diagram shown in FIG. 1, but with the addition of a recording stage bewteen the reference load correction system of the present invention and the power amplifier, for recording the program and correction signals for later simultaneous application to the power amplifier.

Although the present invention has been shown and described herein primarily in an arrangement in which it provides reference load correction signal directly into the amplification line which drives a load such as a speaker system, the invention may also be employed in the processing of recorded program information. Thus, the original program, whether it be live or prerecorded, is applied to an amplification line that embodies the reference load correction system of the invention, and the resulting output program that includes the correction voltage introduced by the reference load system of the invention is recorded (or re-recorded if the program came from a prior recording). Then, when the processed recording with the reference load correction signal thereon is applied through any amplifier-load system for driving the load, the reference load correction signal on the recording will provide full correction to the load, just as in the case where the reference load correction system of the invention is physically connected in the amplifier-load line. With the reference load correction circuit thus used as a processor of sound, the speaker correction signal may be added in the commercial recording of records, sound tapes, video tapes, motion picture sound tracks, and the like. In this case, the processed correction signal is actually stored in the recording. Such an arrangement is illustrated in FIG. 12, wherein the recording stage, generally designated 290, is shown connected between the output terminal 14 of reference load correction system 10 and the input terminal 16 of power amplifier 18. While the arrangement of FIG. 12 is shown with the reference load correction system designated 10 as in FIG. 1, it is to be understood that the reference load correction system of any of FIGS. 2-9 may alternatively be employed in place of the system 10 of FIG. 1.

While the invention has been described with reference to presently preferred embodiments, it is to be understood that numerous modifications or alterations may be made by those skilled in the art without departing from the scope and spirit of the invention as set forth in the appended claims.

I claim:

1. A method of correcting for variations in a load having inductive reactance and characteristics resembling those of capacitive reactance, which load is driven by a power amplifier that has an input circuit line through which it receives a variable waveform input program voltage signal, which comprises:

applying said program signal in a separate high frequency channel to inductor correction component high pass phase shifting network means to produce a high frequency correction signal which has a phase lead and frequency response that increase with increasing frequencies so as to compensate for inductive reactance of said load, applying said program signal in a separate low frequency channel to capacitor correction component low pass phase shifting network means to produce a low frequency correction signal which has a phase lag and frequency response that increase with decreasing frequencies so as to compensate for characteristics of said load which resemble capacitive reactance, passing said program signal through a separate midrange channel having midrange band pass filter means therein, and after said program signal has passed through said midrange channel, mixing said high and low frequency correction signals with said program signal and applying such mixture of signals to said power amplifier.

2. The method of claim 1, which comprises relatively adjusting the signal amplitude between said high frequency channel and said midrange frequency channel.

3. The method of claim 2, which comprises automatically adjusting the amplitude of said high frequency channel relative to the amplitude of said midrange channel.

4. The method of claim 3, wherein said automatic adjusting is accomplished by developing a negative DC analog of the high frequency channel signal amplitude, a positive DC analog of the midrange channel signal amplitude, summing such negative and positive DC analogs, and using such sum to adjust circuit component means in said high frequency channel.

5. The method of claim 4, wherein such adjusting of circuit component means comprises adjusting FET means arranged in a resistor configuration.

6. The method of claim 1, which comprises adjusting the signal amplitude of each of said high and low frequency channels relative to the signal amplitude of said midrange channel.

7. The method of claim 1, which comprises deliberately phase-shifting the signal of one of said high frequency and midrange frequency channels to give the high frequency channel signal a substantial phase lead relative to the midrange frequency channel signal.

8. The method of claim 7, which comprises deliberately phase-shifting the signal of one of said high frequency and midrange frequency channels approximately 180° to give the high frequency channel an approximately 180° phase lead relative to the midrange frequency channel signal.

9. The method of claim 8, which comprises inverting said midrange channel signal to provide such phase lead.

10. A load correction system for a power amplifier having a program input adapted for connection to a source of program voltage signal that is variable as to waveform, and having an output connected to a driven load having inductive reactance and characteristics resembling those of capacitive reactance, which comprises:

a separate high frequency channel circuit containing inductor correction component high pass phase shifting network means for producing a high frequency correction signal which has a phase lead and frequency response that increase with increasing frequencies so as to compensate for inductive reactance of said load, a separate low frequency channel circuit containing capacitor correction component low pass phase shifting network means for producing a low frequency correction signal which has a phase lag and frequency response that increase with decreasing frequencies so as to compensate for characteristics of said load which resemble capacitive reactance, and a separate program frequency channel circuit comprising a midrange frequency channel circuit having midrange band pass filter means therein, each of said channel circuits having an input that is electrically connected to said program signal source and having an output, said outputs of said channel circuits being electrically connected to mixing circuit means so as to mix said correction signal components and said program signal, said mixing circuit means having an output that is electrically connected to said power amplifier input for applying such mixture of signals to said power amplifier.

11. A load correction system as defined in claim 10, which comprises amplitude adjusting means in at least one of said high frequency and midrange frequency channel circuits, enabling relative adjustment between the amplitudes of the signals in said high frequency and midrange frequency channel circuits.

12. A load correction system as defined in claim 11, wherein said amplitude adjusting means is automatic.

13. A load correction system as defined in claim 12, wherein said automatic amplitude adjusting means comprises first detector means in said midrange channel circuit providing a positive DC analog of the midrange frequency signal amplitude, second detector means in said high frequency channel circuit providing a negative DC analog of the high frequency signal amplitude, summing circuit means connected to the outputs of said first and second detector means for summing said DC outputs, and gain adjusting means in said high frequency channel circuit operatively connected to the output of said summing circuit means for automatically adjusting the gain of said high frequency channel circuit in response to variations in the sum of said positive and negative DC voltages.

14. A load correction system as defined in claim 13, wherein said gain adjusting means comprises FET means arranged in a resistor configuration.

15. A load correction system as defined in claim 10, which comprises amplitude adjusting means in each of said high and low frequency channel circuits, enabling the amplitudes of said signals in both of said high and low frequency channel circuits to be adjusted relative to the amplitude of the signal in said midrange channel circuit.

16. A load correction system as defined in claim 10, which comprises further phase shifting means in one of said high frequency and midrange frequency channel circuits for providing the signal in said high frequency channel circuit with a substantial phase lead relative to the signal in said midrange frequency channel circuit.

17. A load correction system as defined in claim 16, wherein said further phase shifting means comprises inverter circuit means in one of said midrange frequency and high frequency channel circuits.

18. A load correction system as defined in claim 17, wherein said inverter circuit means is in said midrange channel circuit.

* * * * *